United States Patent
Yamagata et al.

(10) Patent No.: US 8,273,583 B2
(45) Date of Patent: Sep. 25, 2012

(54) METHOD OF MANUFACTURING A LIGHT EMITTING DEVICE AND THIN FILM FORMING APPARATUS

(75) Inventors: Hirokazu Yamagata, Atsugi (JP); Yoshimi Adachi, Atsugi (JP); Noriko Shibata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/775,569

(22) Filed: May 7, 2010

(65) Prior Publication Data

US 2010/0233931 A1 Sep. 16, 2010

Related U.S. Application Data

(60) Continuation of application No. 11/061,861, filed on Feb. 22, 2005, now Pat. No. 7,871,930, which is a division of application No. 10/021,315, filed on Dec. 19, 2001, now Pat. No. 6,909,111.

(30) Foreign Application Priority Data

Dec. 28, 2000 (JP) ................................. 2000-400168

(51) Int. Cl.
H01L 21/66 (2006.01)
(52) U.S. Cl. ........................................................ 438/15
(58) Field of Classification Search .................. None
See application file for complete search history.

(56) References Cited

U.S. PATENT DOCUMENTS

| | | | |
|---|---|---|---|
| 4,739,414 A | 4/1988 | Pryor et al. | |
| 5,698,474 A * | 12/1997 | Hurley | 438/15 |
| 5,801,402 A * | 9/1998 | Shin | 257/80 |
| 5,929,561 A | 7/1999 | Kawami et al. | |
| 5,943,346 A | 8/1999 | Sanada | |
| 6,049,167 A | 4/2000 | Onitsuka et al. | |
| 6,127,363 A | 10/2000 | Doherty, Jr. et al. | |
| 6,172,363 B1 | 1/2001 | Shinada et al. | |
| 6,329,826 B1 * | 12/2001 | Shinada et al. | 324/754.22 |

(Continued)

FOREIGN PATENT DOCUMENTS

EP 1326230 A 7/2003

(Continued)

OTHER PUBLICATIONS

Tsutsui et al., "Electroluminescence in Organic Thin Films," Photochemical Processes in Organized Molecular Systems, 1991, pp. 437-450.

(Continued)

*Primary Examiner* — Charles Garber
*Assistant Examiner* — Andre' C Stevenson
(74) *Attorney, Agent, or Firm* — Eric J. Robinson; Robinson Intellectual Property Law Office, P.C.

(57) ABSTRACT

A method of manufacturing a light emitting device is provided in which satisfactory image display can be performed by the investigation and repair of short circuits in defect portions of light emitting elements. A backward direction electric current flows in the defect portions if a reverse bias voltage is applied to the light emitting elements having the defect portions. Emission of light which occurred from the backward direction electric current flow is measured by using an emission microscope, specifying the position of the defect portions, and short circuit locations can be repaired by irradiating a laser to the defect portions, turning them into insulators.

20 Claims, 11 Drawing Sheets

U.S. PATENT DOCUMENTS

| | | | |
|---|---|---|---|
| 6,333,065 | B1 | 12/2001 | Arai et al. |
| 6,338,979 | B1 | 1/2002 | Tanaka et al. |
| 6,348,702 | B1 | 2/2002 | Takayama et al. |
| 6,420,031 | B1 | 7/2002 | Parthasarathy et al. |
| 6,512,385 | B1 | 1/2003 | Pfaff et al. |
| 6,590,335 | B1 | 7/2003 | Nagayama |
| 6,605,372 | B1 | 8/2003 | Kubota |
| 6,638,880 | B2 | 10/2003 | Yamamuka et al. |
| 6,673,643 | B2 | 1/2004 | Yamazaki |
| 6,747,728 | B2 | 6/2004 | Nagayama |
| 6,777,710 | B1 | 8/2004 | Koyama |
| 6,830,494 | B1 | 12/2004 | Yamazaki et al. |
| 6,909,111 | B2 | 6/2005 | Yamagata et al. |
| 6,982,760 | B1 | 1/2006 | Honda et al. |
| 7,122,835 | B1 | 10/2006 | Ikeda et al. |
| 7,163,854 | B2 | 1/2007 | Yamazaki et al. |
| 7,203,642 | B2 | 4/2007 | Ishii et al. |
| 7,470,580 | B2 | 12/2008 | Yamazaki et al. |
| 7,575,961 | B2 | 8/2009 | Ikeda et al. |
| 7,871,930 | B2 | 1/2011 | Yamagata et al. |
| 2001/0018267 | A1 | 8/2001 | Shinriki et al. |
| 2002/0074553 | A1* | 6/2002 | Starikov et al. .............. 257/77 |
| 2005/0016687 | A1 | 1/2005 | Shinriki et al. |
| 2006/0081186 | A1 | 4/2006 | Shinriki et al. |
| 2006/0087579 | A1 | 4/2006 | Honda et al. |
| 2007/0007870 | A1 | 1/2007 | Yamazaki et al. |
| 2010/0233931 | A1 | 9/2010 | Yamagata et al. |
| 2011/0136266 | A1 | 6/2011 | Yamagata et al. |

FOREIGN PATENT DOCUMENTS

| | | |
|---|---|---|
| JP | 04-014794 A | 1/1992 |
| JP | 08-185979 A | 7/1996 |
| JP | 09-096662 A | 4/1997 |
| JP | 09-167500 | 6/1997 |
| JP | 09-245965 | 9/1997 |
| JP | 09-266322 | 10/1997 |
| JP | 10-289784 | 10/1998 |
| JP | 10-298784 | 10/1998 |
| JP | 10-321375 A | 12/1998 |
| JP | 11-219133 | 8/1999 |
| JP | 2000-150149 | 5/2000 |
| JP | 2000-180934 | 6/2000 |
| JP | 1 021 070 | 7/2000 |
| JP | 2000-195677 | 7/2000 |
| JP | 2000-196577 A | 7/2000 |
| JP | 2000-208252 | 7/2000 |
| JP | 2000-277256 | 10/2000 |
| JP | 2000-313952 | 11/2000 |
| JP | 2000-331782 A | 11/2000 |
| JP | 2000-353811 | 12/2000 |
| JP | 2001-118684 | 4/2001 |
| JP | 2002-189488 A | 7/2002 |
| JP | 2002-260857 A | 9/2002 |

OTHER PUBLICATIONS

Baldo, et al., "Highly Efficient Phosphorescent Emission from Organic Electroluminescent Devices," Nature, vol. 395, Sep. 10, 1998, pp. 151-154.

Tsutsui et al., "High Quantum Efficiency in Organic Light-Emitting Devices with Iridium-Complex as a Triplet Emissive Center," Japanese Journal of Applied Physics, vol. 38, No. 12B, Dec. 15, 1999, pp. L1502-L1504, Part 2.

Baldo, et al., "Very High-Efficiency Green Organic Light-Emitting Devices Based on Electrophosphoresence," Applied Physics Letters, vol. 75, No. 1, Jul. 5, 1999, pp. 4-6.

Notification (Application No. JP 2001-388187) dated May 27, 2008.

* cited by examiner

X 200

X 500

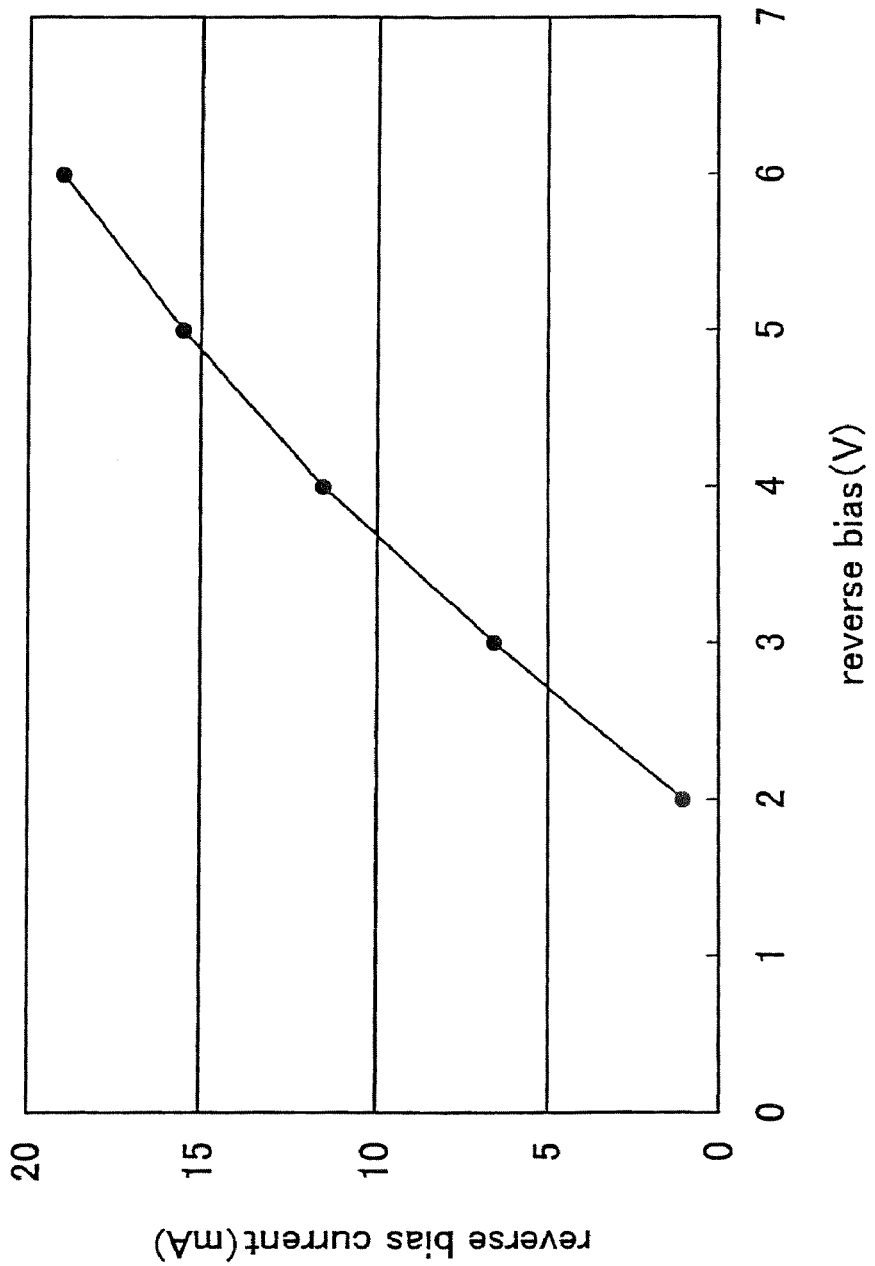
Fig. 11 Current property when a backward bias voltage is applied to a light emitting element

METHOD OF MANUFACTURING A LIGHT EMITTING DEVICE AND THIN FILM FORMING APPARATUS

BACKGROUND OF THE INVENTION

1. Field of the Invention

The present invention relates to a method of manufacturing a light emitting device containing light emitting elements fanned on a substrate, in which locations of short circuits between cathodes and anodes are detected and then repaired. Further, the present invention relates to a method of manufacturing a light emitting device in which locations of short circuits are detected, and then repaired, in a light emitting module wherein an IC is mounted to a light emitting panel manufactured by sealing light emitting elements formed on a substrate, using a sealing substrate. Note that the terms light emitting panel and light emitting module are generic names for light emitting devices throughout this specification. In addition, a thin film formation device capable of manufacturing a light emitting device by detecting the aforementioned short circuit locations and then repairing them is contained within the present invention.

2. Description of the Related Art

A light emitting element has high visibility because they emit light by itself, and is optimal for making a light emitting device thin because there is no need for a back light which is not necessary for a liquid crystal display device, and there is no limitation on the field of view. Light emitting devices using light emitting elements have therefore drawn attention recently as substitutes for CRTs and LCDs.

A light emitting element has a layer containing an organic compound in which electro luminescence (luminescence generated by the application of an electric field) is obtained (hereafter referred to as an organic compound layer), an anode, and a cathode. Two types of light emission exist in organic compound luminescence, light emission when returning to a ground state from a singlet excitation state (fluorescence), and light emission when returning to a ground state from a triplet excitation state (phosphorescence), and the method of detecting and then fixing short circuit locations of the present invention is applicable to both of light emitting devices employing each of light emissions.

Note that all layers formed between an anode and a cathode are defined as organic compound layers within this specification. Specifically, layers such as light emitting layers, hole injecting layers, electron injecting layers, hole transporting layers, and electron transporting layers are included as organic compound layers. Light emitting elements basically have a structure in which an anode, a light emitting layer, and a cathode are laminated in order. In addition to this structure, the light emitting elements may take other structures such as one in which an anode, a hole injecting layer, a light emitting layer, and a cathode are laminated in order, and one in which an anode, a hole injecting layer, a light emitting layer, an electron transporting layer, and a cathode layer are laminated in order.

Further, elements formed by an anode, an organic compound layer, and a cathode are referred to as light emitting elements within this specification.

Light emitting elements are formed by forming an organic compound layer between an anode and a cathode. Electrons are injected to the organic compound layer from the cathode, and holes are injected from the anode to the organic compound layer, if a voltage is applied to the electrodes of the light emitting elements.

The organic compound forming the organic compound layer then emits light in accordance with energy generated by recombination of electrons and holes in the organic compound layer.

However, if there are defects in a portion of the organic compound layer due to any reason, then short circuits occur between the cathode and the anode, and a leak current flows in the short circuit locations. Therefore, the light emitting element stops emitting light.

Reasons for defects in the organic compound layer include a case where the organic compound layer may not be formed uniformly by such that the surface of one electrode, formed prior to the formation of the organic compound layer, is not made level. In addition, there is a case in which the organic compound layer may not be formed enough on the electrode because there is dust on the electrode. If another electrode is formed on the organic compound layer having defect locations, then short circuits will occur between the cathode and the anode in portions at which the organic compound layer is not formed (defect locations).

A simple cross sectional view of a light emitting element 1104 is shown in FIG. 10A. An organic compound layer 1102 is formed on an anode 1101, and a cathode 1103 is formed on the organic compound layer 1102, forming the light emitting element 1104. Note that if a portion of the organic compound layer 1102 has a defect portion 1105 in the light emitting element 1104, then short circuits occur because the anode 1101 is contacted with the cathode 1103 in the defect portion 1105 when forming the cathode 1103 on the organic compound layer 1102.

Note that, throughout this specification, the locations at which two electrodes contact in the defect portions in the organic compound layer 1102 is referred to as the defect portion 1105, compared with a normal portion 1106 having the organic compound layer between the two electrodes.

The light emitting element 1104 normally emits light when an electric power source voltage is applied from an external electric power source 1107.

A case in which the light emitting element 1104 does not have the defect portion 1105 namely, a case in which the light emitting element 1104 only has the normal portion 1106 of FIG. 10A is shown in FIG. 10B. If an electric power source voltage $E_{ori}$ from the external power source 1107 is applied, then a voltage $E_{dio}$ is applied to the light emitting element 1104. Note that a wiring resistance is denoted by reference symbol $R_{wir}$ at this time, and that a voltage applied to a wiring is denoted by reference symbol $E_{wir}$.

In contrast, a case in which the light emitting element 1104 has the defect portion 1105 shown in FIG. 10A is shown in FIG. 10C. If the voltage $E_{ori}$ is applied from the external electric power source 1107, then the voltage applied to the normal portion 1106 becomes $E'_{dio}$, smaller than the voltage $E_{dio}$ shown in FIG. 10B. This is because a voltage drop occurs in the wiring in accordance with an electric current $I_{def}$ flowing in the defect portion 1105, and because the wiring voltage drops from $E_{wir}$ to $E'_{wir}$.

Note that light is emitted in the organic compound layer when an electric current $I_{ori}$ flows in the organic compound layer after a forward bias is applied to both of the electrodes of the light emitting element. The light emitting element does not emit light in a case in which more electric current flows in the defect portions than in the organic compound layer.

In other words, the electric current $I_{dio}$ hardly flows in the normal portions i because most of the current flows in the defect portions when a forward bias is applied to a light emitting element containing a defect portion. This causes light emitting elements that have defect portions to emit light at a lowered brightness, or to turn off altogether, because it becomes difficult for electric current to flow in the organic compound layer.

Note that, in addition to the lowered brightness of the light emitting element or zero light emission therefrom, electric current always flows in the defect portion, and this promotes deterioration of the organic compound layer in the periphery of the defect portion if there is a short circuit in the defect portion.

Furthermore, the turn off of the light emitting element due to the defect portion 1105 induces the problem of a reduction in the display brightness in a pixel portion in which a plurality of pixels each having a light emitting element are formed. There is also a problem in that the electric power consumption is increased along with the occurrence of a leak current.

SUMMARY OF THE INVENTION

In view of the above problems, an object of the present invention is to provide a method of manufacturing a light emitting device in which any defect portions in light emitting elements are detected, and in the case where a defect portion is detected, the defect portion is repaired. In addition, an object of the present invention is to provide a thin film forming apparatus for manufacturing a light emitting device using this method.

The present invention has been devised to solve the above problems. When applying a reverse bias to the light emitting element, an electric current flows in the defect portion. This is employed in the present invention.

FIG. 1A is a diagram showing a pixel portion 101 formed on a substrate, and a plurality of pixels 102 are formed in the pixel portion 101. The pixels each have a light emitting element formed by an anode, a cathode, and an organic compound layer.

In the case in which the light emitting element has a defect portion 103, a cross sectional structure thereof is shown in FIG. 1B. If a voltage is applied to both electrodes of the light emitting element from an external electric power source 108, an electric current flows in the defect portion 103. However, a light emitting element 104 turns off because it becomes difficult for electric current to flow in the organic compound layer 107 if a current is flowing in the defect portion 103.

A reverse bias is applied to the light emitting element 104 composed of a cathode 105, an anode 106, and an organic compound layer 107 from the external electric power source 108 in the present invention.

The organic compound layer 107 is damaged in the defect portion 103 of the light emitting element 104 at this point, and there is a short circuit between the cathode 105 and the anode 106. Namely, electric current flows in the defect portion 103 of the light emitting element 104 if a reverse bias is applied. In contrast, almost no electric current flows in the light emitting elements 104 that do not have the defect portion 103.

Electric current thus flows only in the defect portion 103 by applying the reverse bias in the present invention, and the locations of the defect portions 103 can be determined by detecting this electric current flow.

Next, the short circuit portions between the cathode and the anode in the defect portion 103 are made into insulators by irradiating a laser to the determined defect portions 103. The amount of electric current flowing during the application of the reverse bias can be reduced, or completely prevented, by making the defect portions 103 into insulators. Note that the term electric current flowing in the application of a reverse bias is referred to as a reverse direction electric current within this specification.

The leak current of the defect portion 103, which occurs when a forward bias is applied, can be prevented by making the short circuit locations into insulators, and a predetermined electric current thus flows in the organic compound layer 107. The light emitting element 104 can therefore be made to emit light at the desired brightness.

In addition, a light emitting device can be manufactured in the present invention using a thin film forming apparatus having a film formation chamber for forming organic compound layers and passivation films of the light emitting element, a processing chamber for performing sealing, and a processing chamber for determining the location of defect portions, and then performing repair of the defect portions, using the present invention. Note that the light emitting device can be manufactured by performing the repair of the defect portions after forming the light emitting elements and before performing sealing when manufacturing the light emitting device using this thin film forming apparatus.

BRIEF DESCRIPTION OF THE DRAWINGS

In the accompanying drawings:

FIG. 11 is a diagram for explaining electrical property when a reverse bias is applied to a defect portion.

DETAILED DESCRIPTION OF THE PREFERRED EMBODIMENTS

Embodiment Mode

Figure 2A:
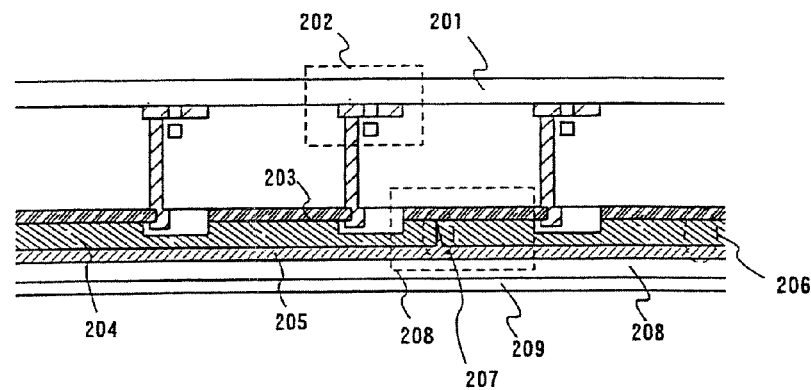
FIGS. 2A and 2B are diagrams for explaining a method of detecting and repairing defect portions according to the present invention.
Figure 2B:
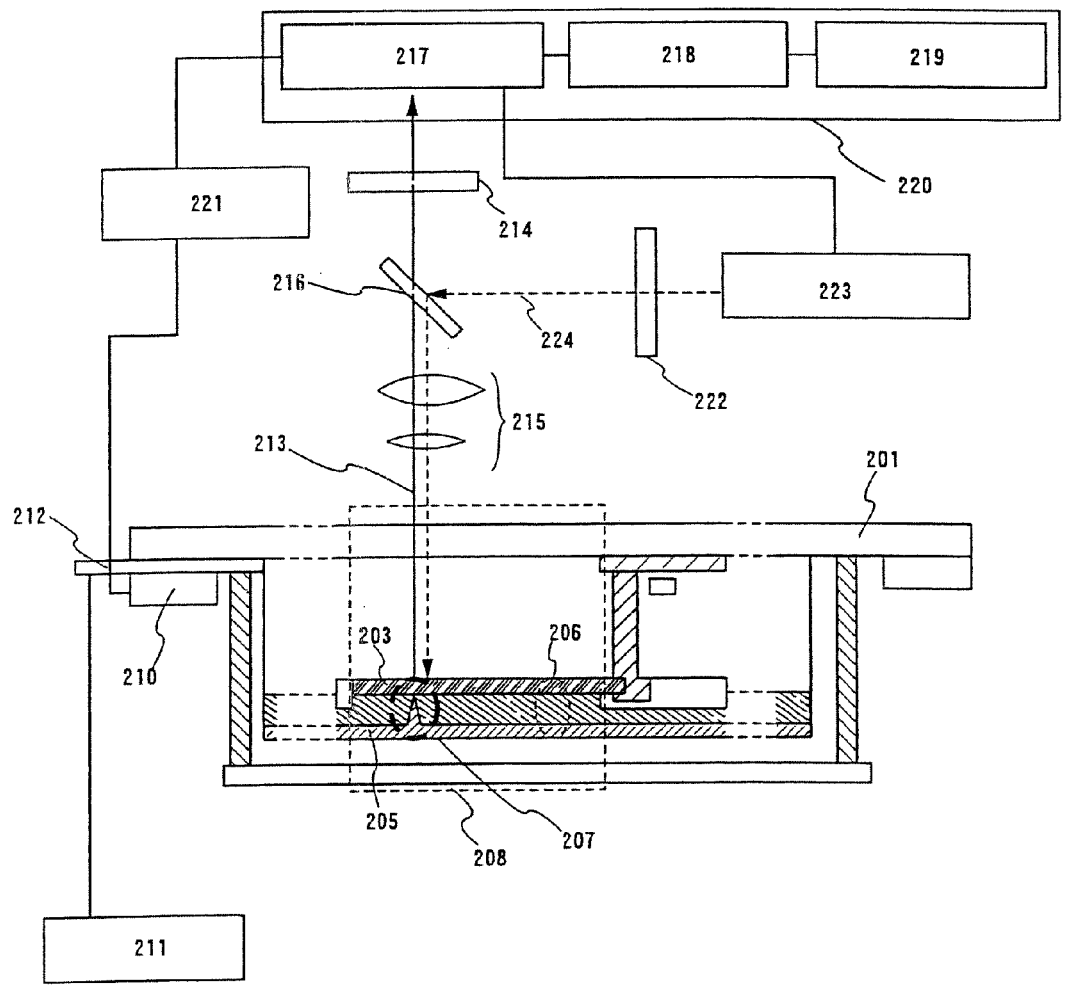

A method of detecting defect portions and a method of repairing the detected defect portions in an active matrix light emitting device are explained here with reference to FIGS. 2A and 2B in an embodiment mode of the present invention. Note that the present invention can also be implemented similarly for a passive light emitting device.

Figure 1A:
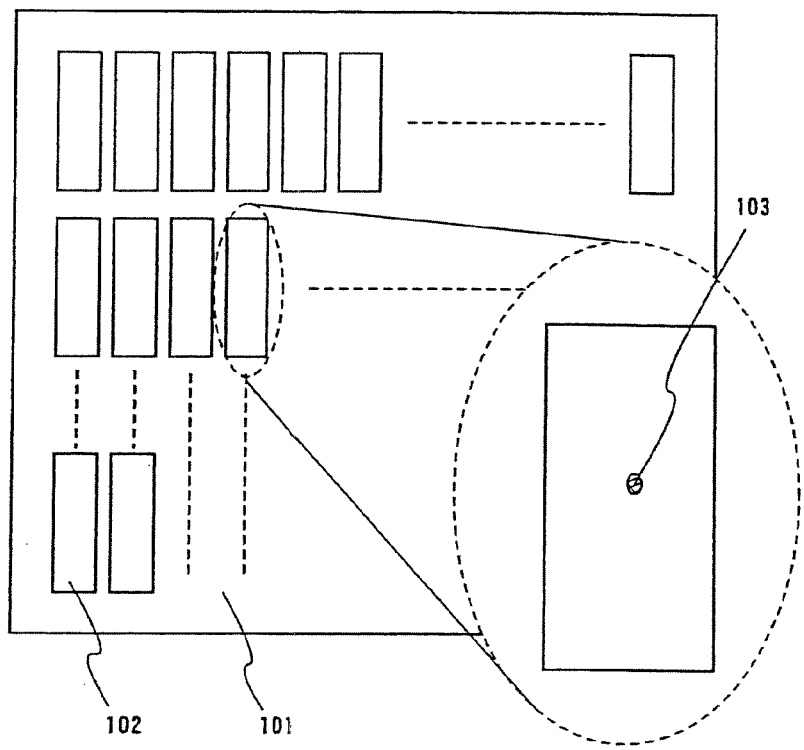
FIGS. 1A and 1B are diagrams for explaining a method of detecting and repairing defect portions according to the present invention.
Figure 1B:
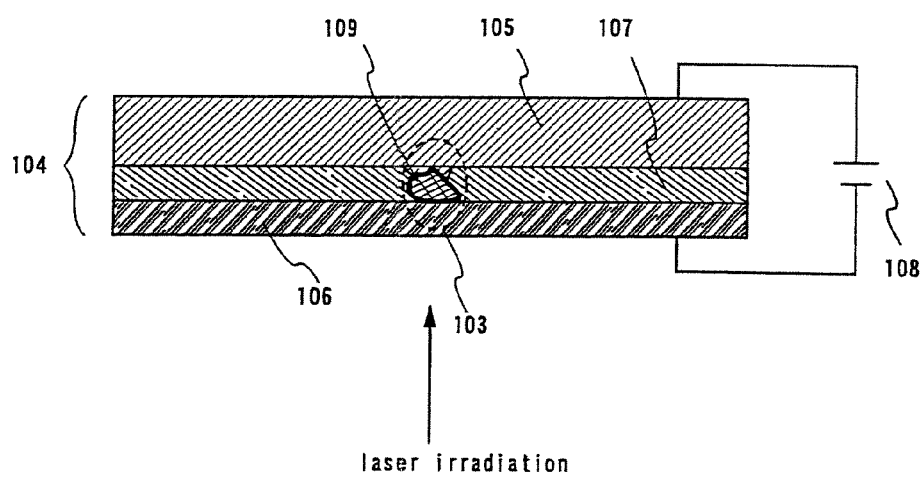

FIG. 2A shows a structure, turned upside down, in which a TFT 202 is formed on a substrate 201, a pixel electrode 203 (anode) electrically connected to the TFT 202 is formed, an organic compound layer 204 is formed on the pixel electrode 203, a cathode 205 is formed, and a light emitting element 206 is thus Mimed. In other words, the light emitting element 206 shown in FIG. 2A and composed of the anode 203, the organic compound layer 204, and the cathode 205 is formed in each of the pixels 102 shown by FIG. 1A, thus forming the pixel portion 101.

In addition, a sealed structure is formed by a sealing substrate 209 having an internal space 208 after forming the light emitting element 206. Note that although a light emitting device formed up through the sealed structure is shown here, it is possible to perform detection and repair of defect portions 207 at the point in time of completing the light emitting element 206 (before sealing the light emitting element) in the present invention. Please refer to the subsequent embodiments for a detailed explanation of such a method.

Note that the location at which the organic compound layer 204 includes a defect as shown by reference numeral 207, and at which a short circuit is formed between the cathode 205 and the anode 203, becomes the defect portion 207 in the light emitting element. Even if an electric current is made to flow by applying a forward bias from an external electric power source, light emitting elements having this type of defect portion do not emit light because the amount of electric current flowing in the defect portion 207 is larger than that flowing in the organic compound layer 204.

Detection of the defect portion 207 is performed in the present invention by applying a reverse bias from an external electric power source, causing an electric current to flow in the defect portions 207, and observing light emission occurred by the electric current flowing at this time.

Specifically, a reverse bias is applied to the portions in which a short circuit occurs between the electrodes, an electric current flows, the number of photons in the light emission which occurred by the current flow is observed and measured by an emission microscope, and thus the position of the defect portion 207 at which the short circuit occurs can be determined. Note that the reverse bias applied to the light emitting element 206 at this point is applied in a range of 1 to 15 V. Note also that the emission microscope is a device in which the number of photons of emitted light that occurred by the electric current flowing when a reverse bias is applied is measured by an optical microscope and an extremely sensitive camera (photon counting camera). A Hot Electron Device (C3200 series) made by Hamamatsu Photonics Corporation is used as an emission microscope in the implementation of the present invention.

This camera is composed of an image intensifier (I.I.) and a photographic camera, and can detect a microscopic amount of light. The emission light thus detected is input to an image processor as an image signal, is subjected to image processing, and is displayed on a TV monitor (cathode ray tube, CRT). It becomes possible to determine locations at which light is emitted by superimposing this display on a pattern image on the substrate which has already been taken.

It is known that in general, light emitted in a wide, continuous spectrum from visible light to the infrared is detected when current leaks occur by short circuits between the electrodes. In the extremely high sensitivity camera (photon counting camera) used by the present invention, a crystal containing Si is capable of penetrating infrared light of a wavelength longer than the wavelength corresponding to the band gap energy. Therefore, it is possible to detect, through the substrate, the electric current flowing in the defect portion 207 when the reverse bias is applied.

A pixel 208 having a defect portion 207, from among the plurality of pixels shown in FIG. 2A, is shown in FIG. 2B, and a method of determining the location of the defect portion 207, and then performing repair, is explained.

The substrate 201 is placed on an XYZ stage 210, and a reverse bias is applied to the light emitting element 206 formed on the substrate 201 from an external electric power source 211 through an FPC 212. An electric current (reverse direction current) flows in the defect portion 207 of the light emitting element 206 at this time.

The electric current flowing here accompanies emitted light 213. Photons forming the emitted light 213 are detected by an extremely high sensitivity camera 217 (photon counting camera) through a condenser lens 215 and a half mirror 216 when a shutter (1) 214 is opened. The detected photons are taken in as an image signal, and displayed on a color monitor 219 (CRT) by performing image processing with an image processing mechanism 218 (image processor). A shutter (2) 222 is closed at this time.

The electric current flowing in the defect portion of the light emitting element of the pixel is displayed in color as a distribution of the number of photons of light that occurs by the current flow on the color monitor 219, and therefore it becomes possible to determine that the location at which the photons are displayed in color is the defect portion 207.

In the present invention, the extremely high sensitivity camera 217 is connected to a positioning mechanism 221, and the positioning mechanism 221 sends a signal, from the position data of the defect portion 207 determined by the extremely high sensitivity camera 217, for moving the XYZ stage 210 to locations for irradiating a laser to the defect portions 207. The defect portion 207 is thus moved to the location at which the laser is irradiated.

The shutter (1) 214 is closed next, the shutter (2) 222 is opened, and a laser 224 is made incident from a laser irradiation mechanism 223. Note that the laser 224 is irradiated to the defect portion 207 through the half mirror 216 and the condenser lens 215.

Repair of the defect portion 207 is thus carried out by irradiating the laser to the detected defect portion 207. Specifically, the short circuit locations between the cathode 205 and the anode 203 in the defect portion 207 are made into insulators by irradiation of the laser, and the space between the cathode 205 and the anode 203 is made into an insulator.

Note that a method of making a material forming the cathode 205 or the anode 203 into an insulator by causing oxidation with laser irradiation, and a method of making an insulator by physically separating the short circuit location of the defect portion 207 with laser irradiation, exist as a method of turning the defect portion 207 into an insulator. It is possible to use both the methods by adjusting the power of the laser in the present invention.

Note that, in the case of irradiating a laser in the present invention, it is necessary to adjust the irradiation power and the irradiation time of the laser such that there is no damage to the function of the anode 203 by irradiating the laser to the anode 203.

It is preferable to use a dye laser as the laser employed in the present invention. Note that a wavelength region in a range from 375 to 900 nm can be employed when using a dye laser, and that laser dyes such as cumarin and rhodamin can be used depending on the wavelength region to be used. Note also that the laser dye used at this point may use known dyes. Further, the beam size of the laser used in the present invention is preferably larger than that of the defect portion 207 to be irradiated. Specifically, it is preferable that the beam size of the laser be from 1.0 to 3.0 μm.

Leak currents occur in the location of short circuit between the anode 203 and the cathode 205 in the case where the light emitting element 206 has the defect portion 207 when a forward bias is applied to the light emitting elements forming the pixels of a light emitting device. Therefore, it becomes difficult for electric current to flow in the organic compound layer 204 of the light emitting element 206, and the light emitting element 206 consequently does not emit light. In other words, the pixel turns off.

The defect portion 207 can be detected in the present invention by first feeding an electric current to the defect portion 207 by the application of a reverse bias to the light emitting element 206, and then by detecting the light emitted from this current. A laser is irradiated to the defect portion 207 so as to make it into an insulator, and thus, the defect portion 207 is repaired. As a result, the pixel is capable of emitting light again when applying a forward bias.

Embodiments

Embodiment 1

An example of using the present invention in an active matrix light emitting device having two thin film transistors (TFTs) in each pixel will be explained in Embodiment 1

Figure 3:
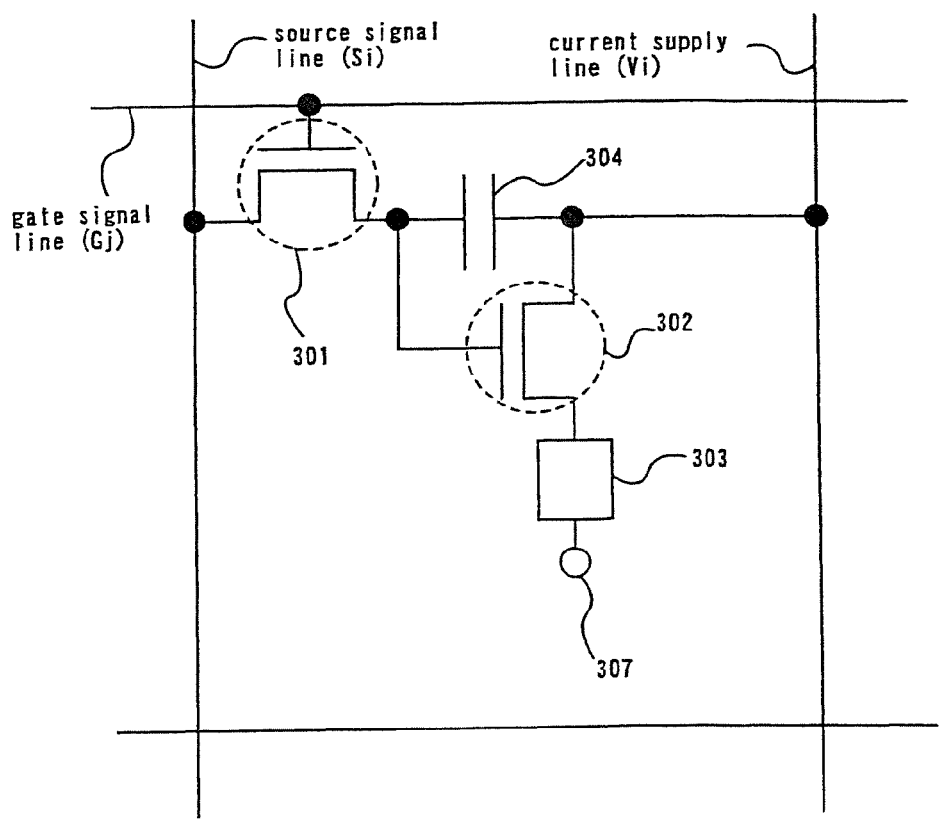
FIG. 3 is a circuit diagram of a pixel.

FIG. 3 is a circuit diagram of a pixel in a light emitting device in which detection and repair of defect portions of a light emitting element is performed using the present invention. Each pixel has a source signal line Si (where i is any one of 1 to x), an electric current supply line Vi (where i is any one of 1 to x), and a gate signal line Gj (where j is any one of 1 to y).

Further, each pixel has a switching TFT 301, an electric current control TFT 302, a light emitting element 303, and a capacitor 304.

A gate electrode of the switching TFT 301 is connected to the gate signal line Gj. Further, one of a source region and a drain region of the switching TFT 301 is connected to the source signal line Si, and the other one is connected to a gate electrode of the electric current control TFT 302.

A source region of the electric current control TFT 302 is connected to the electric current supply line Vi, and a drain region of the electric current control TFT 302 is connected to one of the two electrodes of the light emitting element 303. The electrode of the light emitting element 303 which is not connected to the drain region of the electric current control TFT 302 is connected to an opposing electric power source 307.

Note that the electrode of the light emitting element 303 connected to the drain region of the electric current control TFT 302 is referred to as a pixel electrode, and that the electrode connected to the opposing electric power source 307 is referred to as an opposing electrode.

Further, the capacitor 304 is formed between the gate electrode of the electric current control TFT 302 and the electric current supply line Vi.

Figure 4A:
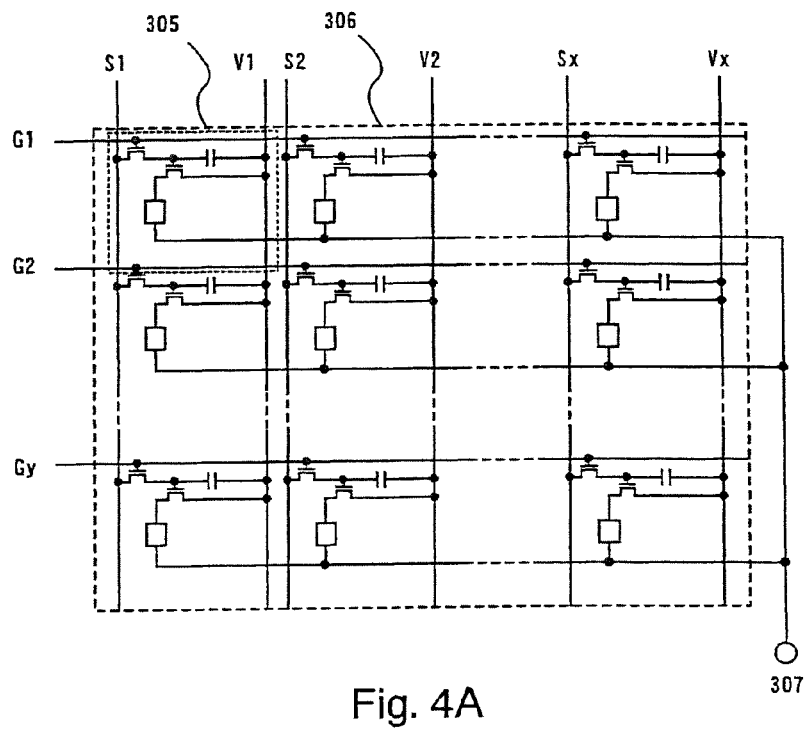
FIGS. 4A and 4B are a circuit diagram of a pixel and a diagram showing the operation of a pixel portion during detection, respectively.

FIG. 4A shows a pixel portion of a light emitting device having a plurality of the pixels shown in FIG. 3. A pixel portion 306 has the source signal lines S1 to Sx, the electric current supply lines V1 to Vx, and the gate signal lines G1 to Gy. A plurality of pixels 305 are arranged in a matrix shape in the pixel portion 306.

Figure 4B:
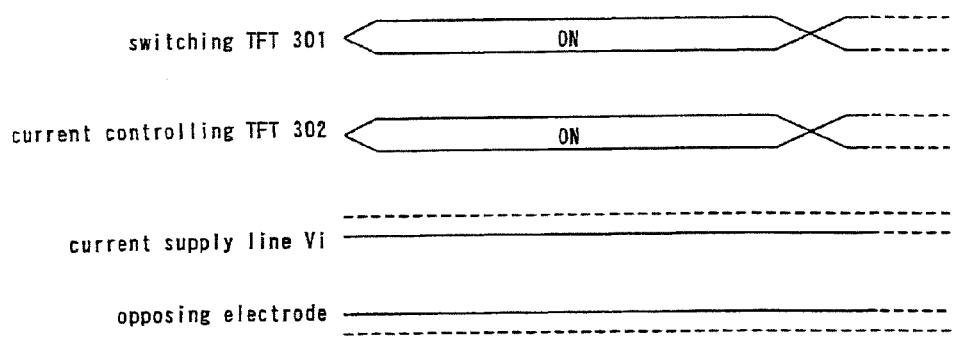

FIG. 4B shows the operation of the TFTs in each pixel and the amount of voltage input to the electric current supply line Vi and to the opposing electrode during detection by checking defect portions in the light emitting elements 303. The switching TFT 301 and the electric current control TFT 302 of each pixel are both placed in an on state when detection of the defect portion of the light emitting element 303 is performed. The voltage of the electric current supply lines Vi and the voltage of the opposing electrodes are then fixed, and a predetermined reverse bias is applied to the light emitting element. Note that a voltage higher than the voltage of the electric current supply line Vi is applied to the opposing electrode when the anode is the pixel electrode, but a voltage lower than the voltage of the electric current supply line Vi is applied when the cathode is the pixel electrode, as shown in FIG. 4B.

Embodiment 1 shows a case in which the pixel electrode is the anode, and the opposing electrode is the cathode. Specifically, a voltage of +1 V is applied to the anode, and a voltage of +9 V is applied to the cathode.

An electric current thus flows in only the defect portion of the light emitting elements by applying a low voltage to the anode of the light emitting element, and a high voltage to the cathode of the light emitting element. The defect portion is then detected in this state of electric current flowing in the defect portion by observation using an emission microscope.

The emission microscope is an apparatus capable of measuring the number of photons forming light emission occurred when an electric current flows. The emission microscope is set in advance such that different colors are displayed in accordance with the measured number of photons. The positions of the defect portions can thus be determined from the amount of electric current flowing in the defect portions in applying the reverse bias.

Further, the emission microscope has taken an image of the light emitting element in advance, and therefore the defect portions can be accurately determined by superimposing this image on the colored display in accordance with the measured number of photons.

Figure 5A:
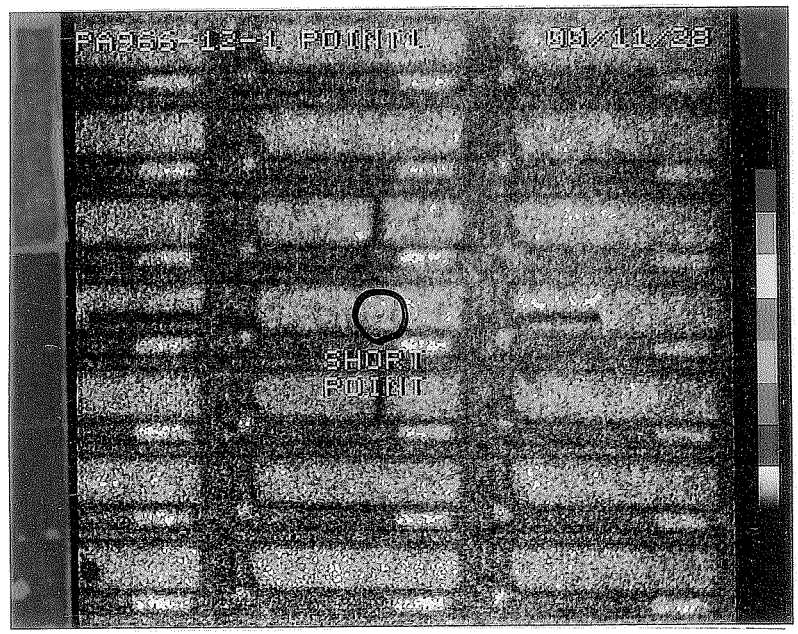
FIGS. 5A and 5B are photographs of defect portions viewed by emission microscopy.
Figure 5B:
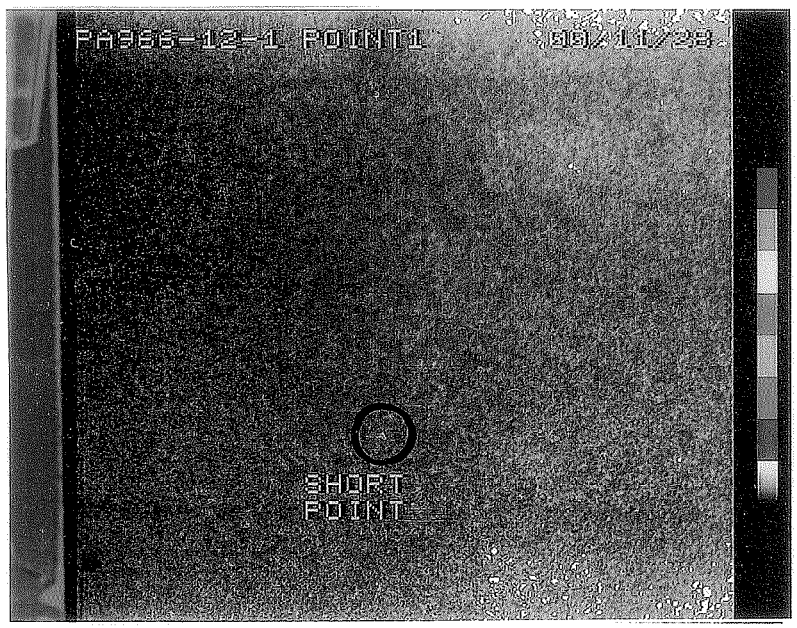

A state in which the defect portion is determined by actual observation of the light emitting element of the pixel portion using an emission microscope is shown in FIGS. 5A and 5B. Portions shown with circular symbols are actual defect portions in FIGS. 5A and 5B, and the black and white photograph images of the pixel portion are generally displayed according to color with a color monitor.

Note that the term colored display in accordance with the number of photons indicates that the display is represented according to colors in accordance with the number of photons forming the light occurred from the electric current flowing in the defect portion. In other words, in the case where the number of photons detected is small, a distribution of blue color points is displayed, while a distribution of yellow color points is displayed if the number of photons becomes somewhat larger. A distribution of red color points occurs if the number of photons becomes very large. Thus, the display is perforated with different colors.

The locations of short circuits in the defect portions are made into insulators by first detecting the location of the defect portions using the emission microscope, and then irradiating a laser to the defect portions from a laser irradiation mechanism while observing using a monitor. Repair of the defect portions can thus be performed.

A dye laser is used in Embodiment 1. Specifically, coumarin 440 is used as a laser dye with a wavelength of 440 nm and a power of 20 mJ, and the laser is irradiated to the defect portions with a beam size of 2.3 µm.

Further, the short circuit locations can be made into insulators in Embodiment 1 by oxidizing the material forming the cathode in the short circuit location.

Note that the detection and repair of the defect portion of the light emitting element may be performed all at once in all of the pixels 305 of the pixel portion 306, and may also be performed line by line, or pixel by pixel.

An electric current thus flows in the organic compound layer of the light emitting element when a forward bias is applied to the light emitting element, and the organic compound layer can be made to emit light, by performing laser irradiation to the defect portion detected in the light emitting element, making them into insulators.

Further, an electric current will always flow in the defect portion, and degradation of the organic compound layers residing in the periphery of the defect portion easily occurs. However, degradation of the organic compound layers residing in the periphery of the defect portions can be prevented because the leak current can be stopped by making the defect portions into insulators.

Light emitting elements which have stopped emitting light because defect portions exist within the light emitting element can thus be made to once again emit light by repairing the defect portions of the light emitting element in the light emitting device using laser irradiation after first checking and detecting the locations of the defect portions.

The present invention shown above is not applicable only to light emitting devices having the above structure, and can be used for light emitting devices having all types of structures. Note that TFTs using organic semiconductors may also be used in the TFTs of the light emitting device.

Embodiment 2

A case of performing all processing up through a sealing process within the same apparatus is explained in Embodiment 2. The aforementioned processes include performing the detection and repair processes of the present invention after forming a pixel electrode (anodes) of a light emitting element on a substrate, then forming an organic compound layer and a cathode, and performing repair immediately after forming the cathode (and before performing sealing) in the case where the light emitting element has a defect portion. Note that although the light emitting element having a structure in which a pixel electrode (anode) is formed on a substrate, and a cathode is then formed after foaming an organic compound layer on the pixel electrode is explained in Embodiment 2, it is also possible to implement the present invention for the light emitting element having a structure in which a cathode is formed as a pixel electrode, an organic compound layer is formed on the cathode, and an anode is formed on the organic compound layer. However, in any structure, detection and repair of defect portions are performed from the anode side.

Figure 6:
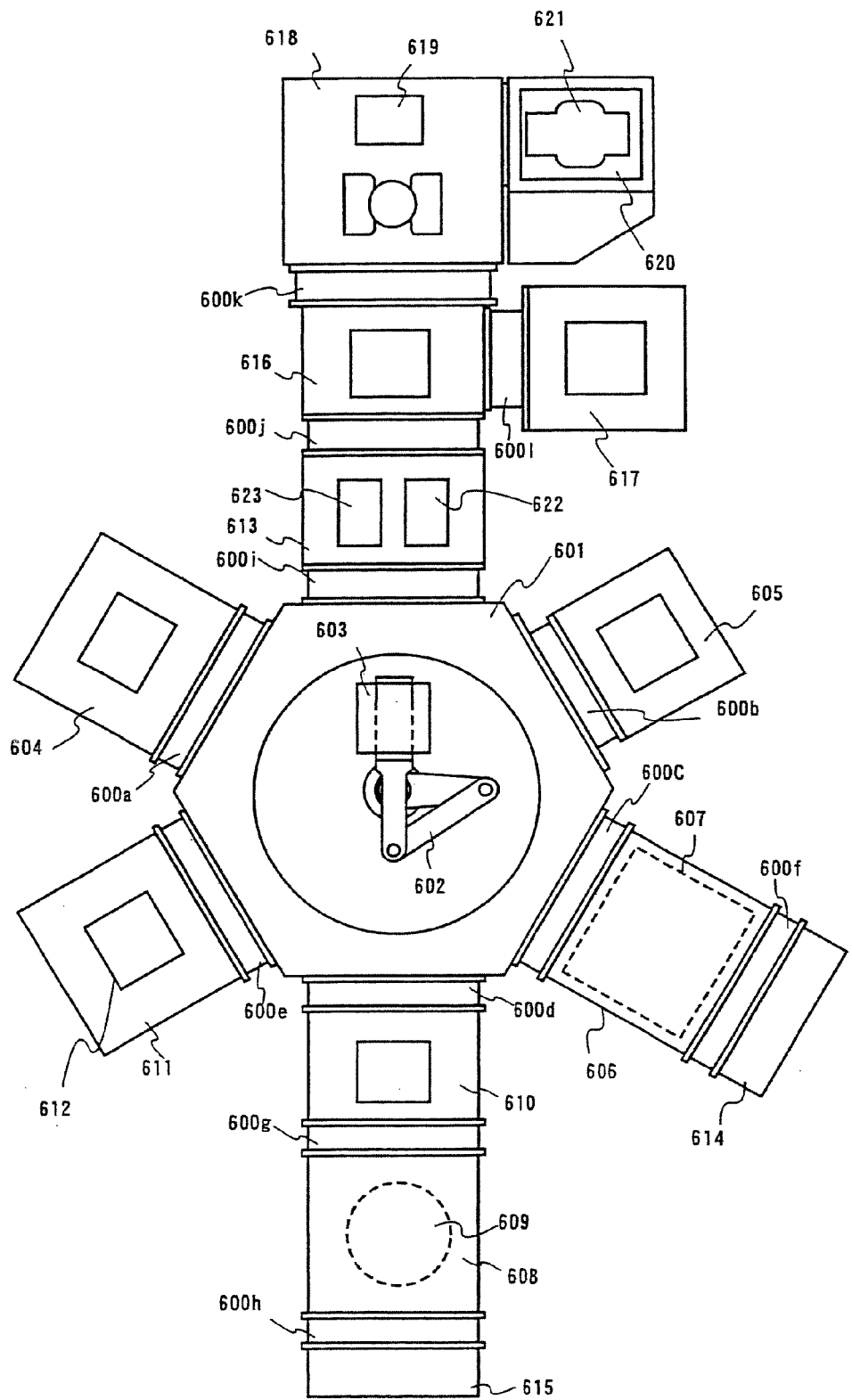
FIG. 6 is a diagram showing a structure of a film forming apparatus used in the present invention.

A film forming apparatus used in Embodiment 2 is explained using FIG. 6. In FIG. 6, reference numeral 601 denotes a conveyor chamber, and the conveyor chamber 601 is provided with a conveyor mechanism (A) 602, which performs conveyance of a substrate 603. The conveyor chamber 601 is kept under a reduced pressure atmosphere, and is connected to each processing chamber by a gate. Transfer of the substrate to each chamber is performed by the conveyor mechanism (A) 602 when the gate is opened. Further, it is possible to use an evacuation pump such as a dry pump, a mechanical booster pump, a turbo molecular pump (magnetic levitation type), or a cryo-pump, for reducing the pressure of the conveyor chamber 601. However, it is preferable to use the magnetic levitation turbo molecular pump in order to obtain a very high purity, high vacuum state.

An explanation of each processing chamber is made below. Note that the conveyor chamber 601 is placed under a reduced pressure atmosphere, and therefore an evacuation pump (not shown) is prepared for each of the processing chambers directly connected to the conveyor chamber 601. The pumps stated above, namely the dry pump, the mechanical booster pump, the turbo molecular pump (magnetic levitation type), and the cryo-pump can be used as the evacuation pump, but it is preferable to use the magnetic levitation turbo molecular pump.

First, reference numeral 604 denotes a loading chamber for performing setting of a substrate, which also serves as an unloading chamber. The loading chamber 604 is connected to the conveyor chamber 601 by a gate 600a, and a carrier (not shown) on which the substrate 603 is set is arranged here. Note that the load chamber 604 may also be divided into a carrying-in chamber of substrate and a carrying-out chamber. Further, the loading chamber 604 is prepared with the aforementioned evacuation pump and a purge line for introducing high purity nitrogen gas or a noble gas. Note that it is preferable to use the turbo molecular pump as the evacuation pump. In addition, a gas purification machine is provided to the purge line, and impurities (such as oxygen and water) in the gas are removed in advance before the gas is introduced into the apparatus.

A substrate in which formation up through a transparent conductive film which becomes a light emitting element anode is performed is used as the substrate 603 in Embodiment 2. The substrate 603 is set in the carrier with the film formation surface facing down in Embodiment 2. This makes a face down method (also referred to as a depot up method) easy to be executed when later performing film formation by evaporation. The face down method is a method in which film formation is performed with the surface of the substrate on which films are to be formed faces down, and this method can suppress the adhesion of dust, and the like.

Next, reference numeral 605 denotes a processing chamber for processing a surface of an anode or a cathode (an anode in Embodiment 2) of a light emitting element (hereafter referred to as a preprocessing chamber), and the preprocessing chamber 605 is connected to the conveyor chamber 601 by a gate 600b. The preprocessing chamber can be changed in various ways depending upon the manufacturing processes of the light emitting element, and in Embodiment 2 it can perform heat treatment at 100 to 120° C. while irradiating ultraviolet light within an oxygen atmosphere to the surface of the anode made of a transparent conductive film. This type of preprocess is effective when processing the anode surface of the light emitting element.

In addition, a method of performing treatment at 200 to 400° C. while irradiating a plasma within an oxygen or hydrogen atmosphere is also effective as another type of pre-process. In this case, a mechanism capable of performing plasma processing and heat treatment may be prepared in the preprocessing chamber.

Reference numeral 606 denotes a film formation chamber for film formation of an organic compound layer by evaporation, which is referred to as a film formation chamber (A). The film formation chamber (A) 606 is connected to the conveyor chamber 601 through a gate 600c.

Film formation of an organic compound layer forming the light emitting elements is performed in a film formation portion 607 within the film formation chamber (A) 606 in Embodiment 2. Note that organic compound layers which emit red color, green color, and blue color, respectively are formed in Embodiment 2. A plurality of evaporation sources disposed within the film formation chamber (A) 606 are prepared with organic compounds for forming the organic compound layers.

Note that the organic compound layer is formed by laminating a plurality of layers, such as a hole injecting layer, a hole transporting layer, a light emitting layer, an electron transporting layer, and an electron injecting layer. In Embodiment 2, the organic compound layer for emitting each color of light is formed by only changing the material forming the light emitting layer, while using the same materials with respect to the other layers.

Copper phthalocyanine and the like can be used for the hole injecting layer, and MTDATA (4,4',4"-tris(3-methylphenylphenylamino)triphenylamine), α-NPD, and the like can be used for the hole transporting layer. It is also possible to use other known materials.

Note that a material in which DCM is doped into Alq$_3$ can be used to form a light emitting layer which emits red color light. In addition, materials such as an Eu complexes (Eu (DCM)$_3$(Phen)), and an aluminum quinolinolate complexes (Alq$_3$) doped with DCM-1 can also be used. It is also possible to use other known materials.

Further, the green color light emitting layer can be formed by common evaporation of CPB and Ir(ppy)$_3$. Note that aluminum quinolinolate complex (Alq$_3$) and benzo-quinolinolate beryllium (BeBq) can also be used. In addition, it is also possible to use a material such as aluminum quinolinolate complex (Alq$_3$) into which coumarin 6 or quinacridon is doped. Other known materials can also be used.

Additionally, The blue color light emitting layer can be formed by using DPVBi, which is a distal derivative, a zinc comlex possessing an azomethine in its ligands, and DPVBi doped with perillin. Other known materials can also be used.

Further, an electron transporting layer or an electron injecting layer may also be formed after formation of the light emitting layer. Note that materials such as 1,3,4-oxyadiazole derivative and 1,2,4-triazole derivative (TAZ) can be used for the electron transporting layer. In addition, materials such as lithium fluoride (LiF), aluminum oxide (Al$_2$O$_3$), and lithium acetyl acetonate (Liacac) may be used as a buffer layer 206. It is also possible to use other known materials.

Furthermore, the film formation chamber (A) 606 is connected to a material exchange chamber 614 through a gate 600f. Note that a heater for heating materials that are exchanged is formed in the material exchange chamber 614. Impurities such as water can be removed by heating the materials in advance. It is preferable that the temperature applied at this time is 200° C. or lower. Further, an evacuation pump capable of placing the material exchange chamber in a reduced pressure state is prepared in the material exchange chamber 614. Therefore the inside of the chamber is placed in a reduced pressure state after heat treatment followed by the addition or exchange of evaporation materials from the outside. The gate 600f is opened after the pressure state becomes the same as that within the film formation chamber, and the evaporation material can be provided as an evaporation source within the film formation chamber. Note that the evaporation material is placed inside the film formation chamber as an evaporation source by using means such as a conveyor mechanism.

Next, reference numeral 608 denotes a film formation chamber for forming a film of an organic compound by spin coating (application method), which is referred to as a film formation chamber (B). Note that a vacuum evacuation processing chamber 610 formed between the film formation chamber (B) 608 and the conveyor chamber (A) 601 is shown, making a structure in which processing at normal pressure (atmospheric pressure) is enabled in only the film formation chamber (B) 608.

The entire inside of the thin film forming apparatus is placed in a reduced pressure state in Embodiment 2, and therefore the pressure difference between the film formation chamber 608 and the inside of the remainder of the film forming apparatus must be overcome in order to convey the substrate to the film formation chamber 608. This is because film formation is performed at normal pressure, reached by using an inert gas such as nitrogen or a noble gas, in the case of performing film formation by an application method using a high molecular weight material.

When forming a film of a high molecular weight material in Embodiment 2, first the pressure of the vacuum evacuation processing chamber 610 is reduced to the same pressure as that of the conveyor chamber (A) 601, and then the gate 600d is opened and the substrate is transported in that state. The gate 600d is then closed, and thereafter the inside of the vacuum evacuation processing chamber 610 is purged by an inert gas, and a gate 600g is opened at the time when normal pressure is reached. The substrate is then conveyed to the film formation chamber 608. The stage may be conveyed together with the substrate here, and the substrate may also be conveyed by a specialized conveying means.

Note that polyparaphenylene vinylenes (PPVs), polyvinyl carbazoles (PVKs), polyfluorenes, and polythiophene derivatives (PEDOT, for example) can be used as the high molecular weight organic compound here. In addition, it is also possible to use other known high molecular weight organic compounds.

A hole injecting layer is thus formed by spin coating in the film formation portion 609 of the film formation chamber 608. Note that a heating mechanism may be prepared in the film formation chamber 608, and provided with a function for performing drying after film formation.

The gate 600g is opened after film formation of the high molecular weight organic compound is completed, and the substrate is conveyed to the vacuum evacuation processing chamber 610. Vacuum evacuation is performed with the gate 600g and the gate 600d in a closed state. Once the vacuum evacuation processing chamber 610 reaches the reduced pressure state equal to that of the conveyor chamber (A) 601, the gate 600d is opened and the substrate is conveyed to the conveyor chamber (A) 601.

The film formation chamber (B) 608 is connected to a material exchange chamber 615 through a gate 600h. Note that a heater for heating exchange materials is formed in the material exchange chamber 615. Impurities such as water can be removed by heating the materials in advance. It is preferable that the temperature applied at this time is 200° C. or lower. Further, an evacuation pump capable of placing the material exchange chamber in a reduced pressure state is prepared in the material exchange chamber 615. Therefore the inside of the chamber is placed in a reduced pressure state after heat treatment followed by the addition or exchange of evaporation materials from the outside. The gate 600h is opened after the pressure state becomes the same as that within the film formation chamber, and the evaporation material can be provided as an evaporation source within the film formation chamber. Note that the evaporation material is placed inside the film formation chamber as an evaporation source by using means such as a conveyor mechanism.

In accordance with the above disclosure, it is possible to form organic compound layers by using evaporation and by using spin coating in Embodiment 2. In addition, an organic compound layer having plurality of layers formed by these methods and laminated together may also be manufactured.

Next, reference numeral 611 denotes a film formation chamber for forming a film of a conductive film, by evaporation, which becomes an anode or a cathode of the light emitting element (a metallic film which becomes a cathode in Embodiment 2), and this chamber is referred to as a film formation chamber (C). The film formation chamber (C) 611 is connected to the conveyor chamber 601 through a gate 600e. An Al—Li alloy film (an alloy film of aluminum and lithium) is formed in Embodiment 2 as a conductive film that becomes the cathode of the light emitting element in a film formation portion 612 within the film formation chamber (C) 611. Note that it is possible to perform common evaporation of aluminum with an element residing in group 1 or group 2 of the periodic table. The term common evaporation denotes a method of evaporation in which evaporation cells are heated at the same time and the different substances are mixed at the film formation stage.

Note that it is preferable to place a charge coupled device (CCD), which is known as an image sensor, each in the film formation chamber (A) 606 and in the film formation chamber (C) 611 since this enables precise position alignment of the substrate and a metal mask when performing film formation using the metal mask.

In addition, it is possible to use pumps such as a dry pump, a mechanical booster pump, a turbo molecular pump (magnetic levitation type), and a cryo-pump as evacuation pumps prepared in the film formation chamber (A) 606, in the vacuum evacuation processing chamber 610 and in the film formation chamber (C) 611. It is preferable to use the cryo-pump or the dry pump in Embodiment 2.

Furthermore, the film formation chamber (A) 606, the vacuum evaporation processing chamber 610, and the film formation chamber (C) 611 are reduced in pressure by using an evacuation pump. Note that it is preferable that the ultimate pressure is $10^{-6}$ Pa or higher at this time. It is effective to make the surface area within the film formation chambers smaller by using electrostatic polishing in order to obtain this type of vacuum level.

The conveyor chamber (A) 601 is connected to a repair chamber 613 through a gate 600*i*. Defect portions of the light emitting element formed up through the cathode are detected by a defect detection mechanism 622, and in addition, a laser is irradiated by a laser irradiation mechanism 623, making the defect portions into insulators. Note that an emission microscope is used in Embodiment 2 as the defect detection mechanism 622 for performing defect portion location determination.

Further, an electric current is made to flow in the defect portions, if the defect portion is included in the state that a reverse bias is applied to the light emitting elements when determining the location of the defect portions by using the emission microscope. The reverse bias applied at this time is in a range of 1 to 15 V.

The substrate which has undergone repair of the defect portions in the light emitting elements within the repair chamber 613 is then conveyed to a conveyor chamber (B) 616 connected to the repair chamber 613 through a gate 600*j*. In addition, the substrate is conveyed to a film formation chamber (D) 617 which is prepared with a chemical vapor deposition (CVD) apparatus and which is connected to the conveyor chamber (B) 616 through a gate 600*l*. An insulating film of a compound film containing silicon, such as silicon nitride or silicon oxide, or a lamination film of a compound film containing silicon and a diamond like carbon (DLC) film containing carbon, is formed on the light emitting elements having undergone repair of their defect portions.

Note that the term diamond like carbon (DLC) film denotes an amorphous film in which diamond bonds ($sp^3$ bonds) and graphite bonds ($sp^2$ bonds) are mixed. Note that oxygen ($O_2$), hydrogen ($H_2$), methane ($CH_4$), ammonia ($NH_3$), and silane ($SiH_4$) can be used in the film formation chamber prepared with the chemical vapor deposition (CVD) apparatus. Further, the CVD apparatus having parallel plate electrodes and an RF electric power source with a frequency set from 13.56 to 60 MHz can be used.

Although not shown in Embodiment 2, it is also possible to provide a film formation chamber for performing film formation by sputtering in the film forming apparatus disclosed by Embodiment 2. This is because film formation by sputtering is effective for the case where elements are formed so as to have a structure in which an anode is formed after forming an organic compound layer on a pixel electrode as a cathode. Note that the concentration of oxygen within formed films can be controlled by performing film formation under an atmosphere in which oxygen is added to argon, and thus a film having a high transmittivity and a low resistance can be formed. Further, it is preferable to cut off this film formation chamber from the conveyor chamber in a manner similar to the other film formation chambers by using a gate.

A mechanism for controlling the temperature of the substrate of film formation may be provided in the case where the film formation chamber for performing sputtering is used. Note that the film forming substrate is preferably maintained at 20 to 150° C. In addition, although it is possible to use a dry pump, a mechanical booster pump, a turbo molecular pump (magnetic levitation type), or a cryo-pump as an evacuation pump prepared in the film formation chamber, it is preferable to use the turbo molecular pump (magnetic levitation type) or the dry pump in Embodiment 2.

Next, reference numeral 618 denotes a sealing chamber (also referred to as an enclosing chamber or a glove box chamber), which is connected to the conveyor chamber (B) 616 through a gate 600*k*. Processing for final sealing of the light emitting elements into a sealed space is performed in the sealing chamber 618. This processing is performed in order to protect the light emitting elements from oxygen and moisture, and uses means of mechanically sealing by a cover material, or sealing by using a thermosetting resin or an ultraviolet curable resin.

Glasses, ceramics, plastics, and metals can be used as the cover material, but translucent materials must be used for the case where light is irradiated to the cover material side. Further, a sealed space is formed by joining the cover material and the substrate on which the light emitting elements are formed by using a sealing material such as a thermosetting resin or an ultraviolet curable resin and then hardening the resin by heat treatment processing or ultraviolet light irradiation processing. It is also effective to form a hygroscopic material, typically barium oxide, within the sealed space.

Furthermore, it is possible to fill the space between the cover material and the substrate on which the light emitting elements are formed by using a thermosetting resin or an ultraviolet curable resin. In this case it is effective to add a hygroscopic material, typically barium oxide, into the thermosetting resin or into the ultraviolet curable resin.

A mechanism 619 for irradiating ultraviolet light to the inside of the sealing chamber 618 (hereafter referred to as an ultraviolet light irradiation mechanism) is formed in the film forming apparatus shown in FIG. 6, which thus has a structure for hardening an ultraviolet curable resin by using ultraviolet light emitted from the ultraviolet light irradiation mechanism 619. Further, it is possible to reduce the pressure within the sealing chamber 618 by attaching an evacuation pump. In the case of performing the above sealing process mechanically using robot operation, contamination by oxygen and moisture can be prevented by conducting the process under a reduced pressure. Note that, specifically, it is preferable to make the concentration of oxygen and the concentration of water 0.3 ppm or lower. Conversely, it is also possible to impart a higher pressure to the sealing chamber 618. In this case, the incursion of oxygen and the like from the outside atmosphere is prevented by imparting a pressure while purging the chamber using high purity nitrogen gas or noble gas.

Next, a delivery chamber (pass box) 620 is connected to the sealing chamber 618. A conveyor mechanism (C) 621 is formed in the delivery chamber 620, and the substrate on which sealing of the light emitting elements is completed in the sealing chamber 618 is conveyed to the delivery chamber 620. It is possible to reduce the pressure of the delivery chamber 620 by attaching an evacuation pump. The delivery chamber 620 is provided so that the sealing chamber 618 is not directly exposed to the outside, atmosphere, and the substrate is taken out from the delivery chamber 620. In addition, it is also possible to form a material supply chamber for supplying the materials used in the sealing chamber 618.

It is thus possible to manufacture a light emitting device having high reliability because repair of the defect portion can thus be performed before sealing the light emitting elements by using the film forming apparatus shown in FIG. 6, and because the performance can be executed without exposure to the outside atmosphere until the light emitting elements are completely sealed within a sealing space.

Embodiment 3

Property observed by an emission microscope when a reverse bias voltage is practically applied to a light emitting element having a defect portion is explained in Embodiment 3.

Light emitting elements used in Embodiment 3 is one in which an anode made from a compound in which indium oxide and tin oxide are combined (ITO) is formed, copper phthalocyanine is formed having a film thickness of 20 nm on the anode by evaporation as a hole injecting layer, and then α-NPD is formed by evaporation on the hole injecting layer with a thickness of 40 nm as a hole transporting layer. Ir(ppy)$_3$, a triplet compound, is formed on the hole transporting layer as a light emitting material for forming a light emitting layer with a film thickness of 20 nm by common evaporation with CBP. In addition, BCP is formed having a film thickness of 10 nm as an electron injecting layer on the light emitting layer, and a 140 nm thick film of aluminum is faulted as a cathode, to thereby complete the light emitting element. Note that, within this specification, the term triplet compound denotes an organic compound that can be utilized in light emission by phosphorescence from triplet excitons, and that a detailed explanation is made in Embodiment 4.

The voltage vs. Current property when a reverse bias voltage is applied to a light emitting element having a defect portion with the above structure is shown in FIG. 11. Note that, in FIG. 11, the horizontal axis shows the voltage when applying the reverse bias (the difference between the voltage applied to the anode and the voltage applied to the cathode), and the vertical axis shows the value of electric current (reverse bias current) flowing in the light emitting element at the time when the reverse bias is applied. Here, the voltage value applied to the anode is fixed at +1 V, and the value of electric current flowing through the light emitting element is measured when the voltage applied to the cathode is changed from +1 to +7 V. In other words, the current values measured here is the value of electric current flowing through the defect portion of the light emitting element in this specification.

The number of photons forming light emitted due to the electric current flowing in the defect portion is detected by the emission microscope. The photons detected by the emission microscope are discriminated by color according to the number of photons, and displayed. Note that the position of the defect portion detected by the colored display is displayed on the CRT by superimposing an image of the light emitting element portion taken in advance on the image taken by the emission microscope, and therefore the position of the defect portion residing in the light emitting elements can be accurately determined.

Note that the reverse bias voltage is applied in a range of 0 to −15 V. This is because there is the possibility that the light emitting elements are damaged if the reverse bias voltage is made larger.

In examining for the defect portions in the present invention, the size of the reverse bias voltage applied to the light emitting elements, and its application time differ depending upon the materials for the anode, the cathode, and the organic compound layer of the light emitting element and the structure of the lamination layer. The effect of the present invention cannot be obtained if the reverse bias voltage is too small. On the contrary, degradation of the organic compound layers, or damage to the light emitting element itself, will occur if the reverse bias voltage is too large.

It is necessary for the operator to appropriately set the size of the reverse bias voltage and its application time depending upon the materials for the anode, the cathode, and the organic compound layer of the light emitting element and the structure of the light emitting element.

Repair of the light emitting element is performed by irradiating a laser to the defect portion in the light emitting element displayed in the CRT, making them into insulators. The results of the measurement of the electric power consumption of the light emitting element before repair and after repair are shown below. Note that the measurements were performed using completely white display and completely black display.

[Table 1]

The results shown above are those in which the electric power consumption was found by measuring the amount of electric current flowing in the cathode of the light emitting element when a driving voltage of 6 to 8 V was applied from an external electric power source. The electric power consumption was reduced by 80 to 90% after repair compared to the electric power consumption before repair for each of the driving voltages. In other words, it can be seen that it is possible to repair the light emitting element by using laser irradiation to make the defect portion into insulator.

Embodiment 4

In the case that defect portions are detected by checking defect portions using the present invention, the organic compound (also referred to as the triplet compound), which can use the phosphorescence from the triplet exciton for the organic compound layer to emit light, can be used by the laser irradiation in the light emitting device having the defect portion to be repaired. A light emitting device using an external light emitting quantum efficiency can be remarkably improved by using an organic compound by which phosphorescence from a triplet exciton can be employed for emitting a light. As a result, the power consumption of the light emitting element can be reduced, the lifetime of the light emitting element can be elongated and the weight of the light emitting element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic compound (coumarin pigment) reported by the above article is represented as follows.

(Chemical Formula 1)

(M. A. Baldo, D. F. O'Brien, Y You, A. Shoustikov, S. Sibley, M. E. Thompson, S. R. Forrest, Nature 395 (1998) p. 151)

The molecular formula of an organic compound (Pt complex) reported by the above article is represented as follows.

(Chemical Formula 2)
(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y Fukuda, T. Wakimoto, S. Mayaguchi, Jpn, Appl. Phys., 38 (12B) (1999) L1502)

The molecular formula of an organic compound (Ir complex) reported by the above article is represented as follows.
(Chemical Formula 3)

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of Embodiments 1 to 3.

Embodiment 5

Figure 7:
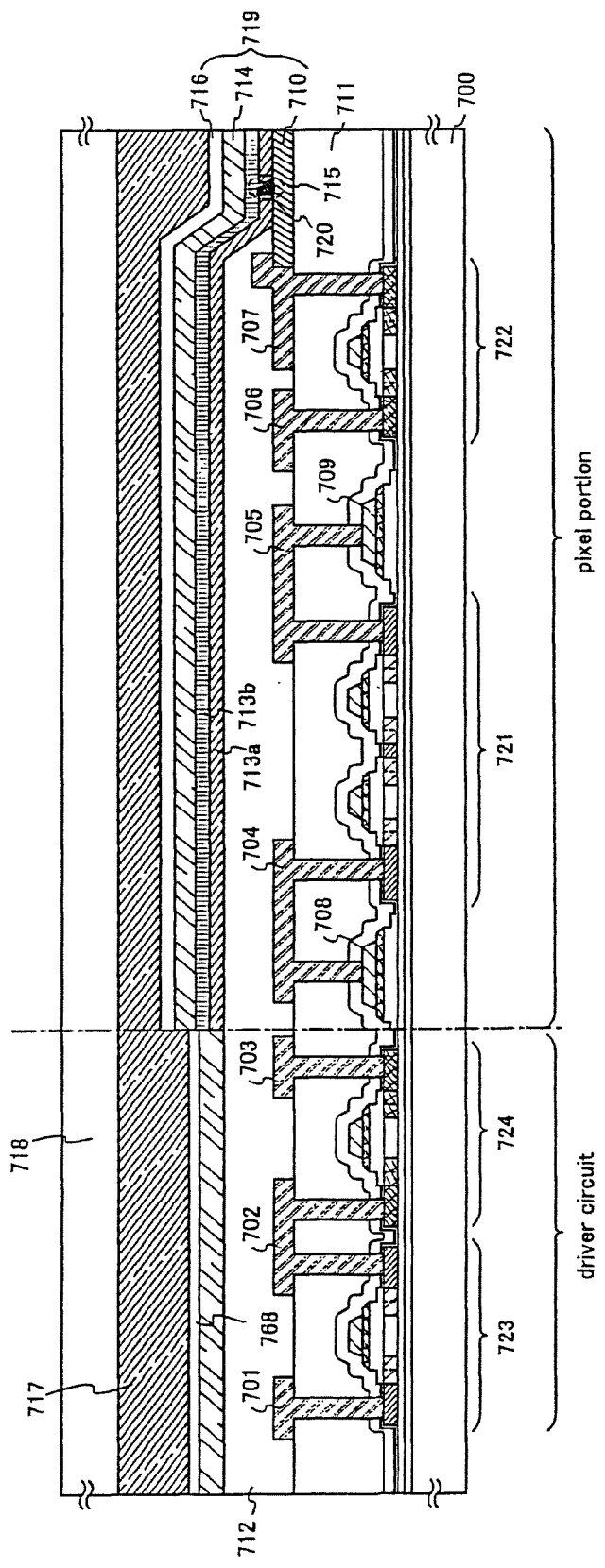
FIG. 7 is a diagram for explaining a cross sectional structure of a light emitting device.

This embodiment gives descriptions on a sectional view shown in FIG. 7 of a light emitting device to which a repair method of the present invention is applied.

In FIG. 7, an n-channel TFT is used for a switching TFT 721 formed on a substrate 700.

The switching TFT 721 in this embodiment has a double gate structure in which two channel formation regions are formed. However, the TFT may take a single gate structure having one channel formation region or a triple gate structure having three channel formation regions.

A driving circuit formed on the substrate 700 has an n-channel TFT 723 and a p-channel TFT 724. Although the TFTs of the driving circuit are of single gate structure in this embodiment, the TFTs may take the double gate structure or the triple gate structure.

Wiring lines 701 and 703 function as source wiring lines of the CMOS circuit whereas 702 functions as a drain wiring line thereof. A wiring line 704 functions as a wiring line that electrically connects a source wiring line 708 to a source region of the switching TFT. A wiring line 705 functions as a wiring line that electrically connects a drain wiring line 709 to a drain region of the switching TFT.

A p-channel TFT is used for a current controlling TFT 722. The current controlling TFT 722 in this embodiment is of single gate structure but it may have the double gate structure or the triple gate structure.

A wiring line 706 is a source wiring line of the current controlling TFT (corresponds to a current supply line). A wiring line 707 is an electrode that is laid on a pixel electrode 710 of the current controlling TFT to be electrically connected to the pixel electrode 710.

The pixel electrode 710 is formed of a transparent conductive film and serves as an anode of a light emitting element. The transparent conductive film is obtained from a compound of indium oxide and tin oxide or a compound of indium oxide and zinc oxide, or from zinc oxide, tin oxide, or indium oxide alone. The transparent conductive film may be doped with gallium. The pixel electrode 710 is formed on a flat interlayer insulating film 711 before forming the above wiring lines. In this embodiment, the film 711 is a planarization film made of resin and it is very important to level the level differences caused by the TFTs with the planarization film 711. An organic compound layer to be formed later is so thin that the existence of level differences can cause light emission defect. Accordingly the surface has to be leveled before forming the pixel electrode so that the organic compound layer is formed on as flat a surface as possible.

After the wiring lines 701 to 707 are formed, a bank 712 is formed as shown in FIG. 7. The bank 712 is formed by patterning an insulating film containing silicon, or an organic resin film, which has a thickness of 100 to 400 nm.

Since the bank 712 is an insulating film, care must be taken to cause static breakdown of the element during film formation. In this embodiment, carbon particles or metal particles are added to the insulating film that is to serve as the material of the bank 712, thereby reducing the resistivity and thus avoiding generation of electrostatic. The amount of carbon particles or metal particles to be added is adjusted such that the resistivity is reduced to $1 \times 10^6$ to $1 \times 10^{12}$ Ωm (preferably $1 \times 10^8$ to $1 \times 10^{10}$ Ωm).

An organic compound layer 713 is formed on the pixel electrode 710. Although only one pixel is shown in FIG. 7, formed in this embodiment are organic compound layers for red light (R), organic compound layers for green light (G), and organic compound layers for blue light (B). Further, the low molecular weight organic compound material is formed by evaporation in this embodiment.

Specifically, the organic compound layer 713 has a laminate structure in which a copper phthalocyanine (CuPc) film with a thickness of 20 nm is formed as a hole injection layer 713a and a tris-8-quinolinolate aluminum complex ($Alq_3$) film with a thickness of 70 nm is formed as a light emitting layer 713b on the hole injection layer. The color of emitted light can be controlled by choosing which fluorescent pigment, such as quinacridon, perylene, or DCM1, is used to dope $Alq_3$.

The material given in the above is merely an example of organic compound materials that can be used for the organic compound layer and there is no need to be limited thereto. The organic compound layer (meaning a layer for light emission and for carrier transportation to emit light) may have freely combinations among the following layers; a light emitting layer, a hole injection layer, a hole transporting layer, an electronic transporting layer or an electronic injection layer, or both. For instance, a high molecular weight organic compound material may be employed for the organic compound layer though used in the example shown in this embodiment is a low molecular weight organic compound material. Known materials can be used for organic compound materials.

On the organic compound layer 713, a cathode 714 is formed from a conductive film. In this embodiment, an alloy film of aluminum and lithium is used as the conductive film. A known MgAg film (an alloy film of magnesium and silver) may of course be used. An appropriate cathode material is a conductive film made of an element belonging to Group 1 or 2 in the periodic table, or a conductive film doped with a Group 1 or 2 elements.

Formation of the cathode 714 completes a light emitting element 719. The light emitting element 719 here means a capacitor comprising the pixel electrode (anode) 710, the organic compound layer 713, and the cathode 714.

It is effective to provide a passivation film 716 so as to cover the light emitting element 719 completely. The passivation film 716 is an insulating film, examples of which include a carbon film, a silicon nitride film, and a silicon oxynitride film. A single layer or a laminate of these insulating films is used for the passivation film.

It is preferable to use as the passivation film a film that can cover a wide area. A carbon film, a DLC (diamond like carbon) film, in particular, is effective. The DLC film can be formed in a temperature range between room temperature and 100° C., and therefore is easy to form above the organic compound layer 713 that has a low heat resistance. Furthermore, the DLC film is highly effective in blocking oxygen and can prevent oxidization of the organic compound layer 713.

Therefore the organic compound layer 713 can be saved from being oxidized before a sealing step to be carried out subsequently.

A seal 717 is provided on the passivation film 716 and a cover member 718 is bonded. A UV-curable resin can be used as the seal 717. It is effective to place a substance having a hygroscopic effect or a substance having an antioxidizing effect inside the seal 717. The cover member 718 used in this embodiment is a glass substrate, a quartz substrate, or a plastic substrate (including a plastic film) with carbon films (preferably diamond like carbon films) formed on its front and back.

Thus completed is a light emitting device structured as shown in FIG. 7. It is effective to use a multi chamber type (or in line type) film forming apparatus to successively process the steps subsequent to formation of the bank 712 up through formation of the passivation film 716 without exposing the device to the air. The successive processing for avoiding exposure to the air may further be extended to include the step of bonding the cover member 718.

The TFTs in this embodiment are each characterized in that: a gate electrode is formed from a conductive film having two layers; almost no difference in concentration is found between low concentration impurity regions that are formed between a channel formation region and a drain region, thereby forming a gentle concentration gradient; and the low concentration impurity regions are classified into one that overlaps with the underlying gate electrode (this one is called a GOLD region) and one that does not overlap the gate electrode (this one is called an LDD region). The edges of a gate insulating film, namely, a region above the region that does not overlap the gate electrode and above a high concentration impurity region are tapered.

There is a defect portion in the hole injection layer 713a in the light emitting device of this embodiment. The defect portion in which the pixel electrode (anode) 710 and the cathode 714 are short-circuit, has a defect portion 715. By specification of the location of the defect portion 715 and laser radiation, the defect portion 715 can be changed into the insulating film 720. The leakage current is prevented by changing the defect portion 715 to the insulating film 720. Thus, the extinct light emitting element caused by the leakage current in the defect portion 715 can be emitted again.

This embodiment shows the structure of the pixel portion and of the driving circuit only. However, the manufacturing process according to this embodiment can also form logic circuits such as a signal divider circuit, a D/A converter, an operation amplifier, and a γ-correction circuit on the same insulator which holds the pixel portion and the driving circuit. Additionally, a memory and a microprocessor may be formed.

The light emitting device having the structure of this embodiment can be combined with any of Embodiments 1 to 4.

Embodiment 6

Figure 8:
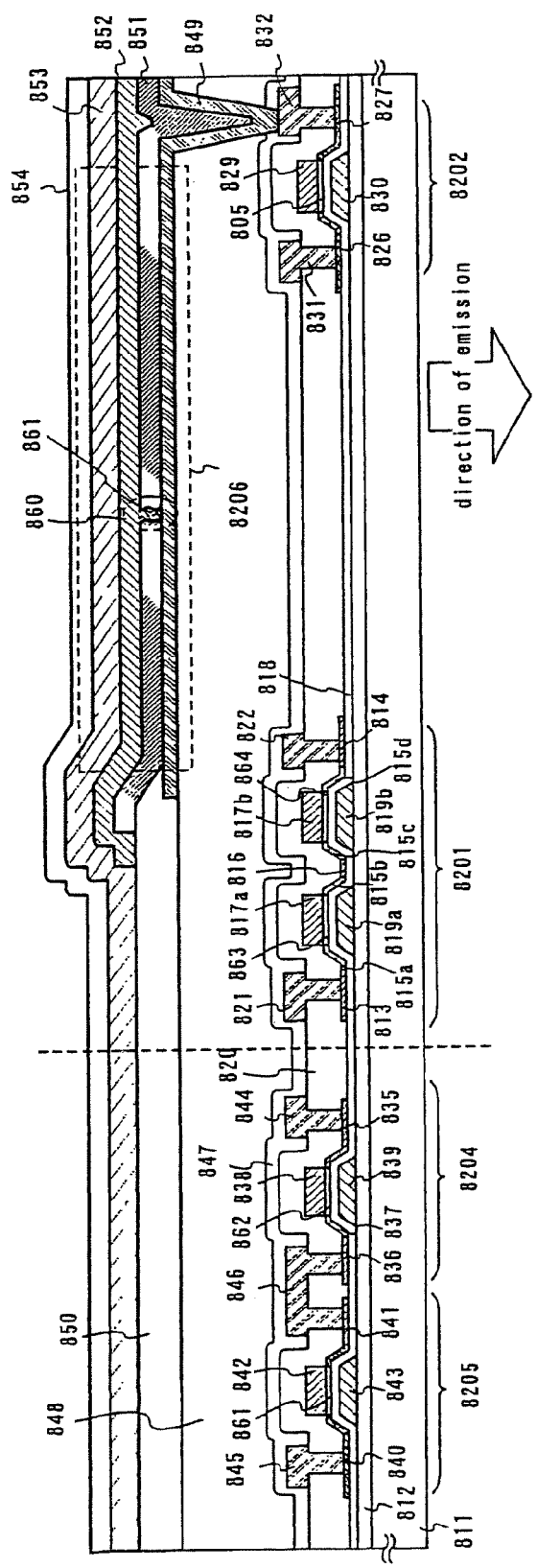
FIG. 8 is a diagram for explaining a cross sectional structure of a light emitting device.

This embodiment is described the repair the defect portion in the light emitting device having a different structure from that of the light emitting device using the checking and repair method in Embodiment 5 with the reference of sectional view in FIG. 8.

Reference numeral 811 denotes a substrate in FIG. 8, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term insulating film containing silicon specifically indicates an insulating film such as a silicon oxide film, a silicon nitride film, and a silicon oxynitride film (denoted as $SiO_xN_y$, where x and y are arbitrary integers) containing oxygen or nitrogen at predetermined ratios with respect to silicon.

Reference numeral 8201 denotes a switching TFT, reference numeral 8202 denotes a current controlling TFT, and both are formed by n-channel TFT and p-channel TFTs respectively. When the direction of light emitted from the light emitting element is toward the substrate lower side (surface where TFTs and the organic compound layer are not formed), the above structure is preferable. However, the present invention is not limited to this structure. The switching TFT and the current controlling TFT may be either n-channel TFTs or p-channel TFTs.

The switching TFT 8201 has an active layer containing a source region 813, a drain region 814, LDD regions 815a to 815d, a separation region 816, and an active layer including channel forming regions 817a and 817b, a gate insulating film 818, gate electrodes 819a and 819b, a first interlayer insulating film 820, a source signal line 821 and a drain wiring 822. Note that the gate insulating film 818 and the first interlayer insulating film 820 may be common among all TFTs on the substrate, or may differ depending upon the circuit or the element.

Furthermore, the switching TFT 8201 shown in FIG. 8 is electrically connected to the gate electrodes 817a and 817b, becoming namely a double gate structure. Not only the double gate structure, but also a multi gate structure (a structure containing an active layer having two or more channel forming regions connected in series) such as a triple gate structure, may of course also be used.

The multi gate structure is extremely effective in reducing the off current, and provided that the off current of the switching TFT is sufficiently lowered, a capacitor connected to the gate electrode of the current controlling TFT 8202 can be have its capacitance reduced to the minimum necessary. Namely, the surface area of the capacitor can be made smaller, and therefore using the multi gate structure is also effective in expanding the effective light emitting surface area of the light emitting elements.

In addition, the LDD regions 815a to 815d are formed so as not to overlap the gate electrodes 819a and 819b through the gate insulating film 818 in the switching TFT 8201. This type of structure is extremely effective in reducing the off current. Furthermore, the length (width) of the LDD regions 815a to 815d may be set from 0.5 to 3.5 µm, typically between 2.0 and 2.5 µm.

Note that forming an offset region (a region which is a semiconductor layer having the same composition as the channel forming region and to which the gate voltage is not applied) between the channel forming region and the LDD region is additionally preferable in that the off current is lowered. Further, when using a multi gate structure having two or more gate electrodes, the separation region 816 (a region to which the same impurity element, at the same concentration, as that added to the source region or the drain region, is added) is effective in reducing the off current.

Next, the current controlling TFT 8202 is formed having an active layer containing a source region 826, a drain region 827, and a channel forming region 829; the gate insulating film 818; a gate electrode 830, the first interlayer insulating film 820; a source wiring 831; and a drain wiring 832. The current controlling TFT 8202 is a p-channel TFT in Embodiment 6.

Further, the drain region 814 of the switching TFT 8201 is connected to the gate electrode 830 of the current controlling TFT 8202. Although not shown in the figure, specifically the gate electrode 830 of the current controlling TFT 8202 is electrically connected to the drain region 814 of the switching TFT 8201 through the drain wiring (also referred to as a connection wiring) 822. The gate electrode 830 is a single gate structure in this embodiment, however, the multi gate structure can be also applied. The source wiring 831 of the current controlling TFT 8202 is connected to an power source supply line (not shown in the figure).

The current controlling TFT 8202 is an element for controlling the amount of electric current injected to the light emitting element, and a relatively large amount of current flows. It is therefore preferable to design the channel width W to be larger than the channel width of the switching TFT. Further, it is preferable to design the channel length L such that an excess of electric current does not flow in the current controlling TFT 8202. It is preferable to have from 0.5 to 2 µA (more preferably between 1 and 1.5 µA) per pixel.

In addition, by making the film thickness of the active layers (particularly the channel forming region) of the current controlling TFT 8202 thicker (preferably from 50 to 100 nm, even better between 60 and 80 nm), deterioration of the TFT may be suppressed. Conversely, it is also effective to make the film thickness of the active layer (particularly the channel forming region) thinner (preferably from 20 to 50 nm, even better between 25 and 40 nm), from the standpoint of making the off current smaller, for the case of the switching TFT 8201.

The structures of the TFTs formed within the pixel are explained above, but a driver circuit is also formed simultaneously at this point. A CMOS circuit, which becomes a basic unit for forming the driver circuit, is shown in FIG. 8.

A TFT having a structure in which hot carrier injection is reduced without an excessive drop in the operating speed is used as an n-channel TFT 8204 of the CMOS circuit in FIG. 8. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 835, a drain region 836, an LDD region 837, and a channel forming region 838. The LDD region 837 overlaps with a gate electrode 839 through the gate insulating film 818.

Formation of the LDD region 837 on only the drain region 836 side is so as not to have drop the operating speed. Further, it is not necessary to be very concerned about the off current with the n-channel TFT 8204, and it is good to place more importance on the operating speed. Thus, it is desirable that the LDD region 837 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 840, a drain region 841, and a channel forming region 842, and a gate insulating film 818 and a gate electrode 843 are formed on the active layer. It is also possible, of course, to take measures against hot carrier injection by forming an LDD region similar to that of the n-channel TFT 8204.

The references numeral 861 to 865 are a mask to form the channel formation regions 842, 838, 817a, 817b and 829.

Further, the n-channel TFT 8204 and the p-channel TFT 8205 have source wirings 844 and 845, respectively, on their source regions, through the first interlayer insulating film 820. In addition, the drain regions of the n-channel TFT 8204 and the p-channel TFT 8205 are mutually connected electrically by a drain wiring 846.

Next, reference numeral 847 denotes a first passivation film, and its film thickness may be set from 10 nm to 1 µm (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Alkaline metals such as sodium are contained in an organic compound layer formed last on the final TFT (in particular, the current controlling TFT). In other words, the first passivation film 847 works as a protecting layer so that these alkaline metals (mobile ions) do not penetrate into the TFT.

Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The organic compound layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal wiring, the data signal wiring and the cathode of the light emitting element. The thickness, therefore, is preferably from 0.5 to 5 µm (more preferably between 1.5 and 2.5 µm).

Further, reference numeral 849 denotes a pixel electrode (anode of the light emitting element) made from a transparent conducting film. After forming a contact hole (opening) in the second interlayer insulating film 848 and in the first passivation film 847, the pixel electrode 849 is formed so as to be connected to the drain wiring 832 of the current controlling TFT 8202. Note that if the pixel electrode 849 and the drain region 827 are formed so as not to be directly connected, as in FIG. 8, then alkaline metals of the organic compound layer can be prevented from entering the active layer via the pixel electrode.

A third interlayer insulating film 850 is formed on the pixel electrode 849 from a silicon oxide film, a silicon oxynitride film, or an organic resin film, with a thickness of from 0.3 to 1 µm. An open portion is formed in the third interlayer insulating film 850 over the pixel electrode 849 by etching, and the edge of the open portion is etched so as to become a tapered shape. The taper angle may be set from 10 to 60°, (preferably between 30 and 50°).

An organic compound layer 851 is formed on the third interlayer insulating film 850. A single layer structure or a lamination structure can be used for the organic compound layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the organic compound layer may also be performed.

The structure of FIG. 8 is an example of a case of forming three types of light emitting elements corresponding to R, G, and B. Note that although only one pixel is shown in FIG. 8, pixels having an identical structure are formed corresponding to red, green and blue colors, respectively, and that color display can thus be performed. It is possible to implement the present invention without concern as to the method of color display.

A cathode 852 of the light emitting element is formed on the organic compound layer 851. A material containing a low work coefficient material such as magnesium (Mg), lithium (Li), or calcium (Ca), is used as the cathode 852. Preferably, an electrode made from MgAg (a material made from Mg and Ag at a mixture of Mg: Ag=10:1) is used. In addition, a MgAgAl electrode, an LiAl electrode, and an LiFAl electrode can be given as other examples.

The light emitting element 8206 is formed by the pixel electrode (anode) 849, the organic compound layer 851 and the cathode 852.

The lamination body comprising the organic compound layer 851 must be formed separately for each pixel, but the organic compound layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing, screen printing or spin coating as the method of selectively forming the organic compound layer. However, the cathode cannot be formed in succession with these methods at present, and therefore it is preferable to use the other methods stated above.

Further, reference numeral 853 denotes a protecting electrode, which protects the cathode 852 from external moisture and the like at the same time is an electrode for connecting to the cathode 852 of each pixel. It is preferable to use a low resistance material containing aluminum (Al), copper (Cu), or silver (Ag) as the protecting electrode 853. The protecting electrode 853 can also be expected to have a heat radiating effect which relieves the amount of heat generated by the organic compound layer.

Reference numeral 854 denotes a second passivation film, which may be formed with a film thickness of 10 nm to 1 μm (preferably between 200 and 500 nm). The aim of forming the second passivation film 854 is mainly for protecting the organic compound layer 851 from moisture, but it is also effective to give the second passivation film 854 a heat radiating effect. Note that the organic compound layer is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

The organic compound layer 851 in the light emitting device of the present invention has a defect portion. There is a defect portion 860 in a defect portion, in which the pixel electrode (anode) 849 and the cathode 852 are short-circuit.

The defect portion 860 can be changed into the insulating film 861 by specification of location of the defect portion 860 and repair the defect portion 860 insulated by the laser radiation. Thus, the extinct light emitting element caused by the leakage current in the defect portion 860 can be emitted again. In addition, the deterioration of the organic compound layer 851 surrounding the defect portion can be prevented the promotion by insulating the defect portion 860.

Note that it is possible to implement the light emitting device having the structure shown in this embodiment by combining freely with structures of Embodiments 1 to 4.

Embodiment 7

A light emitting device using a light emitting element is self-luminous and therefore is superior in visibility in bright surroundings compared to liquid crystal display devices and has wider viewing angle. Accordingly, the light emitting device of the present invention can accomplish various electronic devices.

Examples of electronic devices employing a light emitting device conducting a checking and repair of the defect portion of the light emitting element by the present invention are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game, machine, an electronic book, etc.); and an image reproducing device (specifically, a digital versatile disk (DVD) and the like having a display device that can display the image of the data). The light emitting device having a light emitting element is desirable particularly for a portable information terminal since its screen is often viewed diagonally and is required to have a wide viewing angle. Specific examples of the electronic devices are shown in FIGS. 9A to 9H.

Figure 9A:
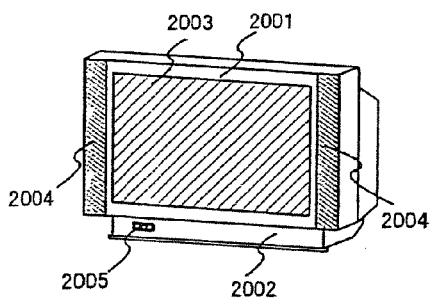
FIGS. 9A to 9H are diagrams showing examples of electronic devices.

FIG. 9A shows a display device, which is composed of a casing 2001, a supporting base 2002, a display unit 2003, speaker units 2004, a video input terminal 2005, etc. In the present invention, the light emitting device is manufactured by using the light emitting device to the display unit 2003, which is formed by conduct a checking and repair of the defect portion of the light emitting element. The light emitting device having a light emitting element is self-luminous and does not need a backlight, so that it can make a thinner display unit than liquid display devices. The display device includes every information display device such as a personal computer, receiving TV broadcasting, and advertisement.

Figure 9B:
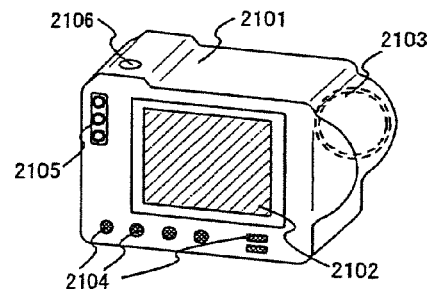

FIG. 9B shows a digital still camera, which is composed of a main body 2101, a display unit 2102, an image receiving unit 2103, operation keys 2104, an external connection port 2105, a shutter 2106, etc. In the present invention, the light emitting device is manufactured by using the light emitting device to the display unit 2102, which is formed by conduct a checking and repair of the defect portion of the light emitting element.

Figure 9C:
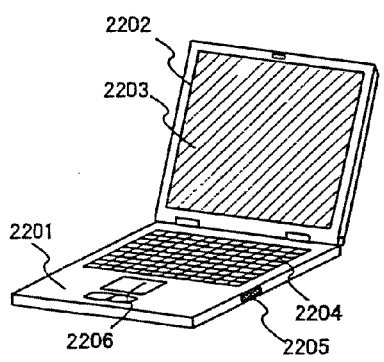

FIG. 9C shows a laptop computer, which is composed of a main body 2201, a casing 2202, a display unit 2203, a keyboard 2204, an external connection port 2205, a pointing mouse 2206, etc. In the present invention, the light emitting device is manufactured by using the light emitting device to the display unit 2203, which is formed by conduct a checking and repair of the defect portion of the light emitting element.

Figure 9D:
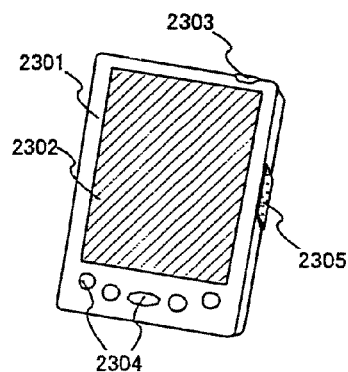

FIG. 9D shows a mobile computer, which is composed of a main body 2301, a display unit 2302, a switch 2303, operation keys 2304, an infrared ray port 2305, etc. In the present invention, the light emitting device is manufactured by using the light emitting device to the display unit 2302, which is formed by conduct a checking and repair of the defect portion of the light emitting element.

Figure 9E:
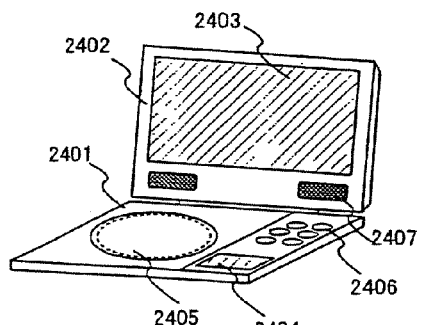

FIG. 9E shows a portable image reproducing device equipped with a recording medium (a DVD player, to be specific). The device is composed of a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays character information. In the present invention, the light emitting device is manufactured by using the light emitting device to the display units A 2403 and B 2404, which is formed by conduct a checking and repair of the defect portion of the light emitting element. The image reproducing device equipped with a recording medium includes video game machines.

Figure 9F:
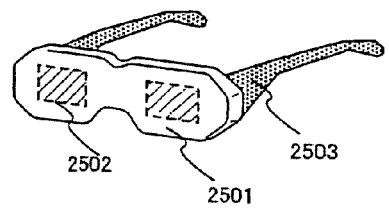

FIG. 9F shows a goggle type display (head mounted display), which is composed of a main body 2501, display units 2502, and arm units 2503. In the present invention, the light emitting device is manufactured by using the light emitting device to the display unit 2502, which is formed by conduct a checking and repair of the defect portion of the light emitting element.

Figure 9G:
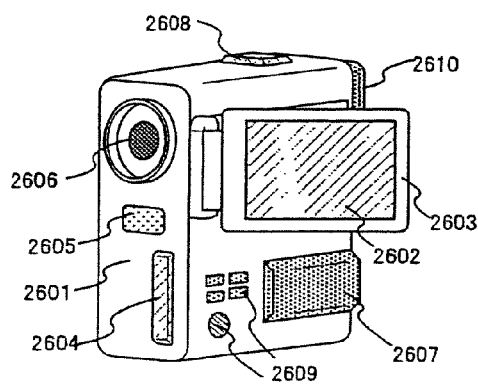

FIG. 9G shows a video camera, which is composed of a main body 2601, a display unit 2602, a casing 2603, an external connection port 2604, a remote control receiving unit 2605, an image receiving unit 2606, a battery 2607, an audio input unit 2608, operation keys 2609, eyepiece portion 2610 etc. In the present invention, the light emitting device is manufactured by using the light emitting device to the display unit 2602, which is formed by conduct a checking and repair of the defect portion of the light emitting element.

Figure 9H:
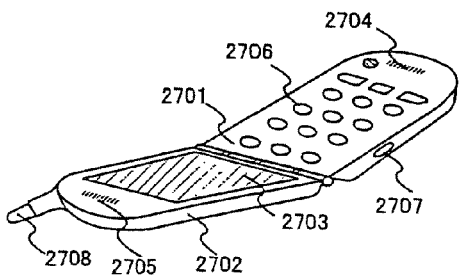
Figure 10A:
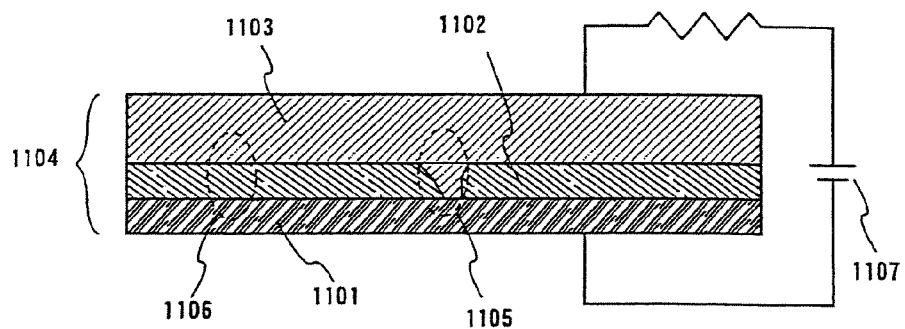
FIGS. 10A to 10C are diagrams for explaining a conventional example.
Figure 10B:
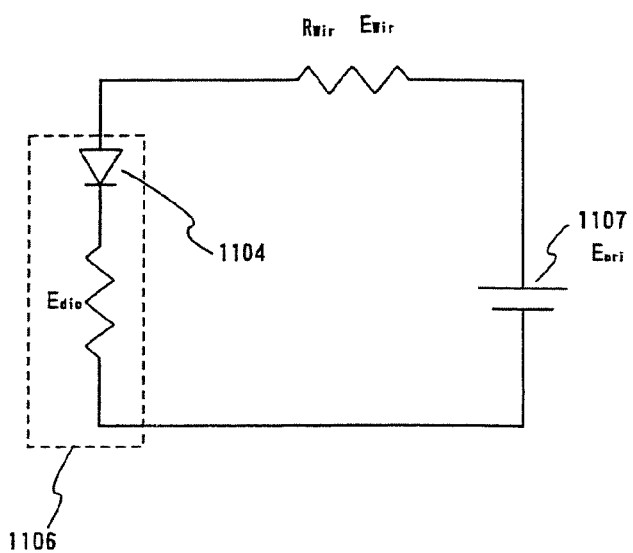
Figure 10C:
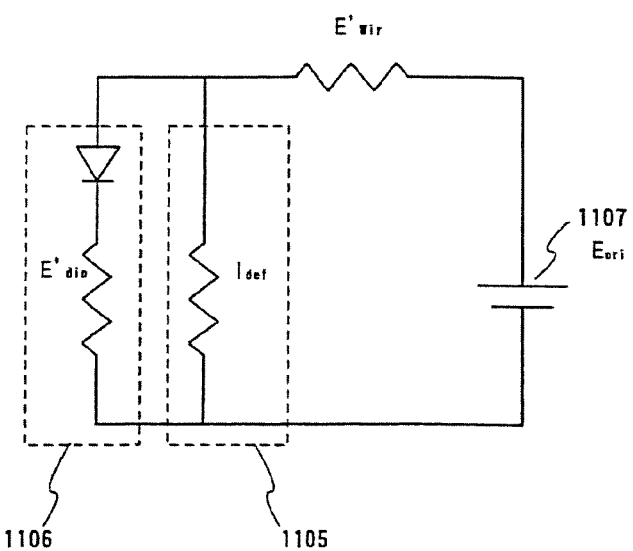

FIG. 9H shows a cellular phone, which is composed of a main body 2701, a casing 2702, a display unit 2703, an audio input unit 2704, an audio output unit 2705, operation keys 2706, an external connection port 2707, an antenna 2708, etc. In the present invention, the light emitting device is manufactured by using the light emitting device to the display unit 2703, which is formed by conduct a checking and repair of the defect portion of the light emitting element. If the display unit 2703 displays white characters on a black background, power consumption of the cellular phone can be reduced.

If the luminance of light emitted from organic compound materials is increased in future, the light emitting device having an organic compound element can be used also in a front or rear projector in which light bearing outputted image information is magnified by a lens or the like to be projected on a screen.

The electronic device given in the above often displays information distributed through electronic communication lines such as Internet and CATV (cable television), especially, animation information with increasing frequency. The light emitting device having an organic compound element is suitable for displaying animation information since organic compound materials have fast response speed.

In the light emitting device, portions that emit light consume power. Therefore it is desirable to display information such that as small portions as possible to emit light. Accordingly, if the light emitting device is used for a display unit that mainly displays character information such as a portable information terminal, in particular, a cellular phone, and an audio reproducing device, it is desirable to assign light emitting portions to display character information while portions that do not emit light serve as the background.

As described above, the application range of the light emitting device conducting a inspection and repair of the light emitting element by the present invention is very wide so that the light emitting device can be applied to various electronic devices of every field. The electronic devices in this embodiment can be accomplished by using the light emitting device formed by implementing Embodiments 1 to 6.

As explained above, according to the present invention, leak currents occurring in short circuit locations can be prevented by detecting the defect portion in the light emitting element, determining the position of the defect portion, irradiating a laser to the defect portion, and then making the short circuit location between the anode and the cathode of the light emitting element into insulators. The light emitting element which has stopped emitting light can thus be made to once again emit light. Note that, according to the present invention, the light emitting device can be manufactured in which the light emitting element having the defect portion is repaired, and therefore the light emitting device production yield can be improved.

Chemical Formula 1

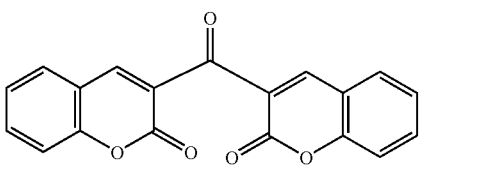

Chemical Formula 2

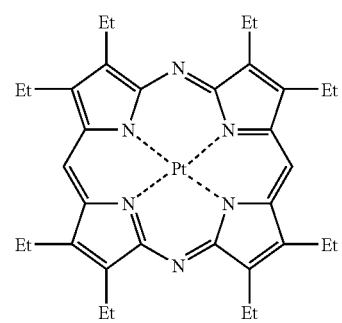

Chemical Formula 3

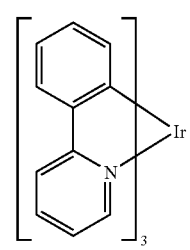

TABLE 1

| driving voltage | display style | electric power consumption of EL [mW] | |
| --- | --- | --- | --- |
| | | before repair | after repair |
| 6 V | completely white display | 57.6 | 6.9 |
| | completely black display | 0.24 | 0.24 |
| 7 V | completely white display | 109.2 | 17.71 |
| | completely black display | 0.28 | 0.28 |
| 8 V | completely white display | 187.2 | 40.8 |
| | completely black display | 0.32 | 0.32 |

What is claimed is:

1. An apparatus for repairing a light emitting element comprising:

a reverse bias applying apparatus configured to apply a reverse bias to the light emitting element;

a light emission detecting apparatus configured to detect light emission from a defect portion of the light emitting element; and a laser configured to irradiate the defect portion with laser light, wherein the defect portion is made into an insulator by irradiation of the laser light.

2. An apparatus for repairing a light emitting element comprising:

a condenser lens;

a reverse bias applying apparatus configured to apply a reverse bias to the light emitting element;

a light emission detecting apparatus configured to detect light emission from a defect portion of the light emitting element through the condenser lens; and a laser configured to irradiate the defect portion with laser light through the condenser lens, wherein the defect portion is made into an insulator by irradiation of the laser light.

3. An apparatus for repairing a light emitting element comprising:

a stage on which the light emitting element is provided;

a reverse bias applying apparatus configured to apply a reverse bias to the light emitting element;

a light emission detecting apparatus configured to detect light emission from a defect portion of the light emitting element; and a positioning mechanism configured to move the stage; and a laser configured to irradiate the defect portion with laser light, wherein the defect portion is made into an insulator by irradiation of the laser light.

4. An apparatus for repairing a light emitting element comprising:

a condenser lens;

a stage on which the light emitting element is provided;

a reverse bias applying apparatus configured to apply a reverse bias to the light emitting element;

a light emission detecting apparatus configured to detect light emission from a defect portion of the light emitting element through the condenser lens;

a positioning mechanism configured to move the stage; and a laser configured to irradiate the defect portion with laser light through the condenser lens, wherein the defect portion is made into an insulator by irradiation of the laser light.

5. An apparatus according to claim 1, wherein the light emission detecting apparatus is an emission microscope.

6. An apparatus according to claim 2, wherein the light emission detecting apparatus is an emission microscope.

7. An apparatus according to claim 3, wherein the light emission detecting apparatus is an emission microscope.

8. An apparatus according to claim 4, wherein the light emission detecting apparatus is an emission microscope.

9. An apparatus according to claim 1, wherein the light emission detecting apparatus is an optical microscope and a photo counting camera.

10. An apparatus according to claim 2, wherein the light emission detecting apparatus is an optical microscope and a photo counting camera.

11. An apparatus according to claim 3, wherein the light emission detecting apparatus is an optical microscope and a photo counting camera.

12. An apparatus according to claim 4, wherein the light emission detecting apparatus is an optical microscope and a photo counting camera.

13. An apparatus according to claim 1, wherein the light emitting element comprises an anode, a cathode and an organic compound layer provided between the anode and the cathode.

14. An apparatus according to claim 2, wherein the light emitting element comprises an anode, a cathode and an organic compound layer provided between the anode and the cathode.

15. An apparatus according to claim 3, wherein the light emitting element comprises an anode, a cathode and an organic compound layer provided between the anode and the cathode.

16. An apparatus according to claim 4, wherein the light emitting element comprises an anode, a cathode and an organic compound layer provided between the anode and the cathode.

17. An apparatus according to claim. 1, wherein the reverse bias applying apparatus applies a reverse bias within a range of 1 to 15 V to the light emitting element.

18. An apparatus according to claim 2, wherein the reverse bias applying apparatus applies a reverse bias within a range of 1 to 15 V to the light emitting element.

19. An apparatus according to claim 3, wherein the reverse bias applying apparatus applies a reverse bias within a range of 1 to 15 V to the light emitting element.

20. An apparatus according to claim 4, wherein the reverse bias applying apparatus applies a reverse bias within a range of 1 to 15 V to the light emitting element.

* * * * *

UNITED STATES PATENT AND TRADEMARK OFFICE
CERTIFICATE OF CORRECTION

PATENT NO.         : 8,273,583 B2                                         Page 1 of 1
APPLICATION NO.    : 12/775569
DATED              : September 25, 2012
INVENTOR(S)        : Hirokazu Yamagata et al.

It is certified that error appears in the above-identified patent and that said Letters Patent is hereby corrected as shown below:

At column 1, line 10, "fanned" should be --formed--;

At column 4, line 63, "Mimed" should be --formed--;

At column 8, line 44, "perforated" should be --performed--;

At column 9, line 31, "foaming" should be --forming--;

At column 15, line 35, "faulted" should be --formed--.

Signed and Sealed this
Twentieth Day of November, 2012

David J. Kappos
*Director of the United States Patent and Trademark Office*